(12) United States Patent
Zhang

(10) Patent No.: US 12,193,284 B2
(45) Date of Patent: Jan. 7, 2025

(54) DISPLAY PANEL AND DISPLAY DEVICE

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventor: Peng Zhang, Wuhan (CN)

(73) Assignees: Wuhan Tianma Micro-Electronics Co., Ltd., Wuhan (CN); Wuhan Tianma Micro-Electronics Co., Ltd. Shanghai Branch, Shanghai (CN)

(*) Notice: Subject to any disclaimer, the term of this patent is extended or adjusted under 35 U.S.C. 154(b) by 459 days.

(21) Appl. No.: 17/545,198

(22) Filed: Dec. 8, 2021

(65) Prior Publication Data
US 2022/0102473 A1  Mar. 31, 2022

(30) Foreign Application Priority Data
Jul. 16, 2021 (CN) .......................... 202110808356.8

(51) Int. Cl.
*H10K 59/131* (2023.01)
(52) U.S. Cl.
CPC .................................. *H10K 59/131* (2023.02)
(58) Field of Classification Search
CPC ... H10K 59/131; G09G 3/2074; H01L 27/124
See application file for complete search history.

(56) References Cited

U.S. PATENT DOCUMENTS

2022/0020840 A1* 1/2022 Kim ..................... G09G 3/3225

FOREIGN PATENT DOCUMENTS

| CN | 107424551 A | 12/2017 |
|----|-------------|---------|
| CN | 111857412 A | 10/2020 |
| CN | 112310163 A | 2/2021 |

OTHER PUBLICATIONS

Chinese Office Action mailed Apr. 29, 2023, issued in related Chinese Application No. 202110808356.8 filed Jul. 16, 2021, 11 pages.

* cited by examiner

*Primary Examiner* — Mohammad A Rahman
(74) *Attorney, Agent, or Firm* — Christensen O'Connor Johnson Kindness PLLC

(57) ABSTRACT

A display panel and a display device are provided. The display panel includes first, second and third data lines located in a display area, first and second compensation capacitors located in a first non-display area and have a same capacitance, and a peripheral circuit located in a second non-display area. The first and second data lines are electrically connected to M sub-pixels, and the third data line is electrically connected to N sub-pixels, where 1≤M<N, M and N are integers. The first and second compensation capacitors are electrically connected to the first and second data lines, respectively. The first non-display area has a length gradually decreasing along a direction parallel to the first direction and along a direction from the display area to the second non-display area, and the length is a size of the first non-display area along the second direction.

20 Claims, 21 Drawing Sheets

DISPLAY PANEL AND DISPLAY DEVICE

CROSS-REFERENCE TO RELATED APPLICATIONS

The present application claims priority to Chinese Patent Application No. 202110808356.8, filed on Jul. 16, 2021, the content of which is incorporated herein by reference in its entirety.

TECHNICAL FIELD

The present disclosure relates to the field of display technologies and, particularly, relates to a display panel and a display device.

BACKGROUND

With the rapid development of display technology, irregularly shaped display panels have been more and more widely used. The irregularly shaped display panel is a display panel with a special shape modified on the basis of the traditional display panel. The design of the irregularly shaped display panel can improve artistic appearance of products equipped with it.

Due to the irregularly shape of the display area of the irregularly shaped display panel, data lines of the irregularly shaped display panel have different lengths in the irregularly shaped display area and the regular shaped display area. The number of sub-pixels connected to the data lines located in the irregularly shaped display area is also different from the number of sub-pixels connected to the data lines located in the regular shaped display area, resulting in a different between the impedance of the data lines in the irregularly shaped display area and the impedance of the data lines in the regular shaped display area, thereby bringing adverse effect to the display uniformity of the display panel.

SUMMARY

In a first aspect of the present disclosure, a display panel is provided. The display panel has a display area, a first non-display area, and a second non-display area, the first non-display area is located between the display area and the second non-display area. The display panel includes sub-pixels located in the display area; a first data line, a second data line and a third data line that are arranged along a first direction and each extending along a second direction intersecting with the first direction; compensation capacitor groups located in the first non-display area; and a peripheral circuit located in the second non-display area. The first data line is electrically connected to M sub-pixels of the sub-pixels, the second data line is electrically connected to M sub-pixels of the sub-pixels, and the third data line is electrically connected to N sub-pixels of the sub-pixels, where 1≤M<N, and both M and N are integers. Each of the compensation capacitor groups includes a first compensation capacitor electrically connected to the first data line, and a second compensation capacitor electrically connected to the second data line. The first compensation capacitor and the second compensation capacitor have a same capacitance. The first non-display area has a length gradually decreasing along a direction parallel to the first direction and along a direction from the display area to the second non-display area, and the length of the first non-display area is a size of the first non-display area along the second direction.

In a second aspect of the present disclosure, a display device including the above display panel is provided.

BRIEF DESCRIPTION OF DRAWINGS

In order to better illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings without any creative effort.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely for the purpose of describing specific embodiment, rather than limiting the present disclosure. The terms "a", "an", "the" and "said" in a singular form in an embodiment of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B can indicate only A, both A and B, and only B. In addition, the symbol "/" in the context generally indicates that the relation between the objects in front and at the back of "/" represents an "or" relationship.

It should be understood that although the terms "first", "second" and "third" can be used in the present disclosure to describe compensation capacitors, these compensation capacitors should not be limited to these terms. These terms are used only to distinguish the compensation capacitors from each other. For example, without departing from the scope of the embodiments of the present disclosure, a first compensation capacitor can also be referred to as a second compensation capacitor. Similarly, the second compensation capacitor can also be referred to as the first compensation capacitor.

Figure 1:
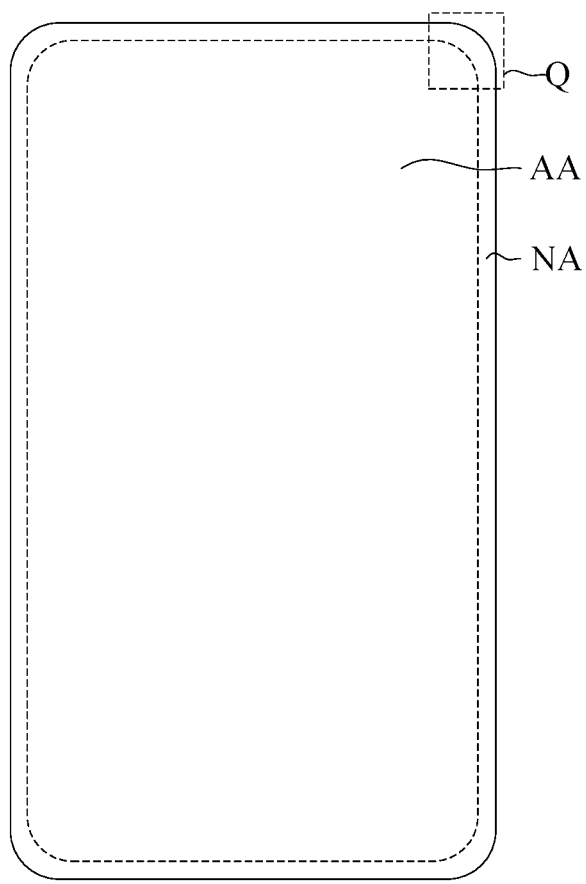
FIG. 1 is a top view of a display panel provided by an embodiment of the present disclosure.

An embodiment of the present disclosure provides a display panel. FIG. 1 is a top view of a display panel provided by an embodiment of the present disclosure. As shown in FIG. 1, the display panel includes a display area AA and a non-display area NA.

Figure 2:
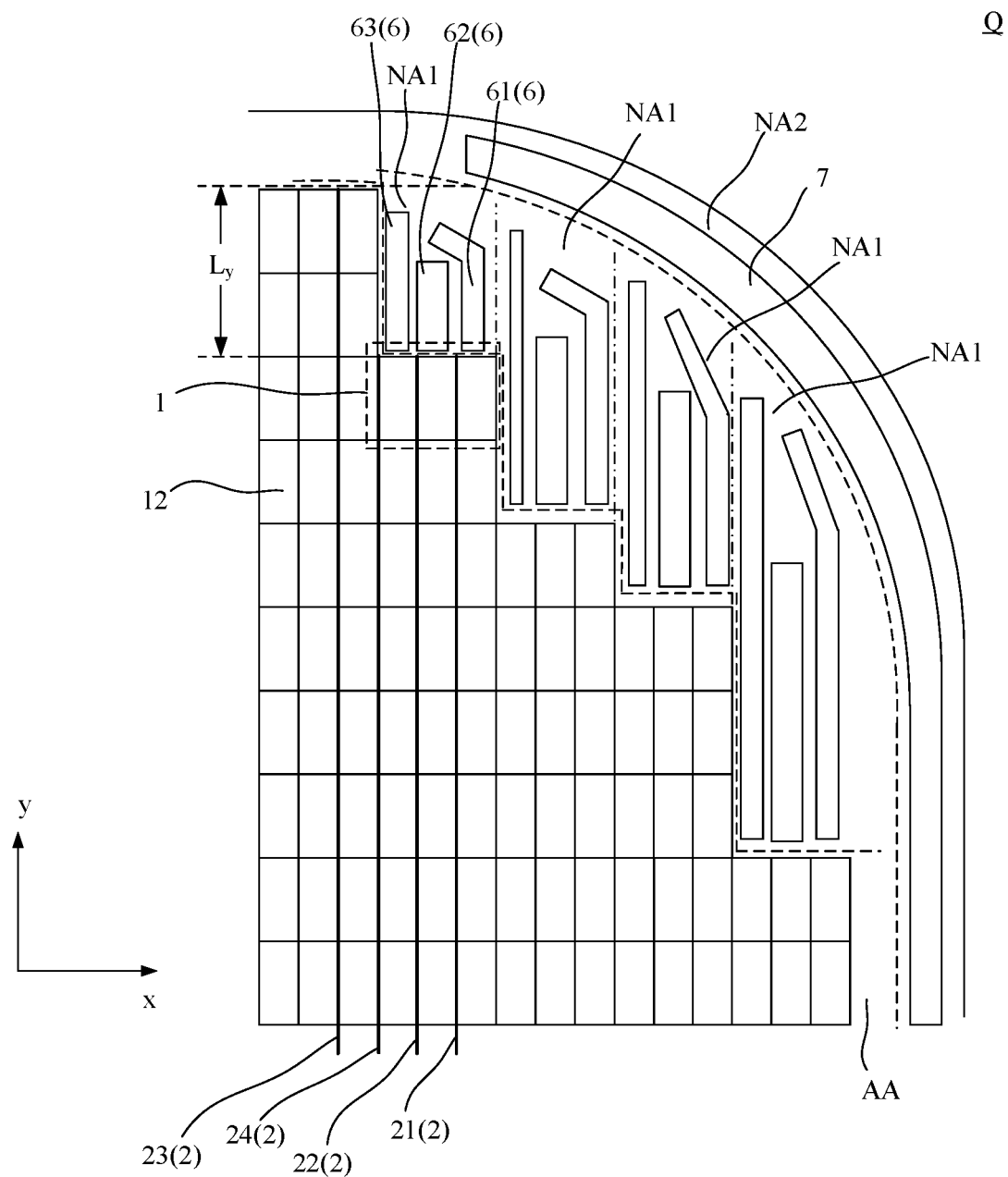
FIG. 2 is an enlarged diagram of an area Q shown in FIG. 1.

FIG. 2 is an enlarged schematic diagram of an area Q shown in FIG. 1. As shown in FIG. 2, the display panel includes a plurality of pixel units 1 located in the display area AA, and the pixel unit 1 includes a plurality of sub-pixels. In an embodiment of the present disclosure, the sub-pixel includes a light-emitting unit (not shown in FIG. 2) and a pixel driving circuit 12 that are electrically connected to each other. One pixel unit includes multiple light-emitting units capable of emitting light of different colors. For example, the pixel unit includes a red light emitting unit capable of emitting red light, a green light emitting unit capable of emitting green light, and a blue light emitting unit capable of emitting blue light. The pixel driving circuit includes a storage capacitor and at least two thin film transistors.

Figure 3:
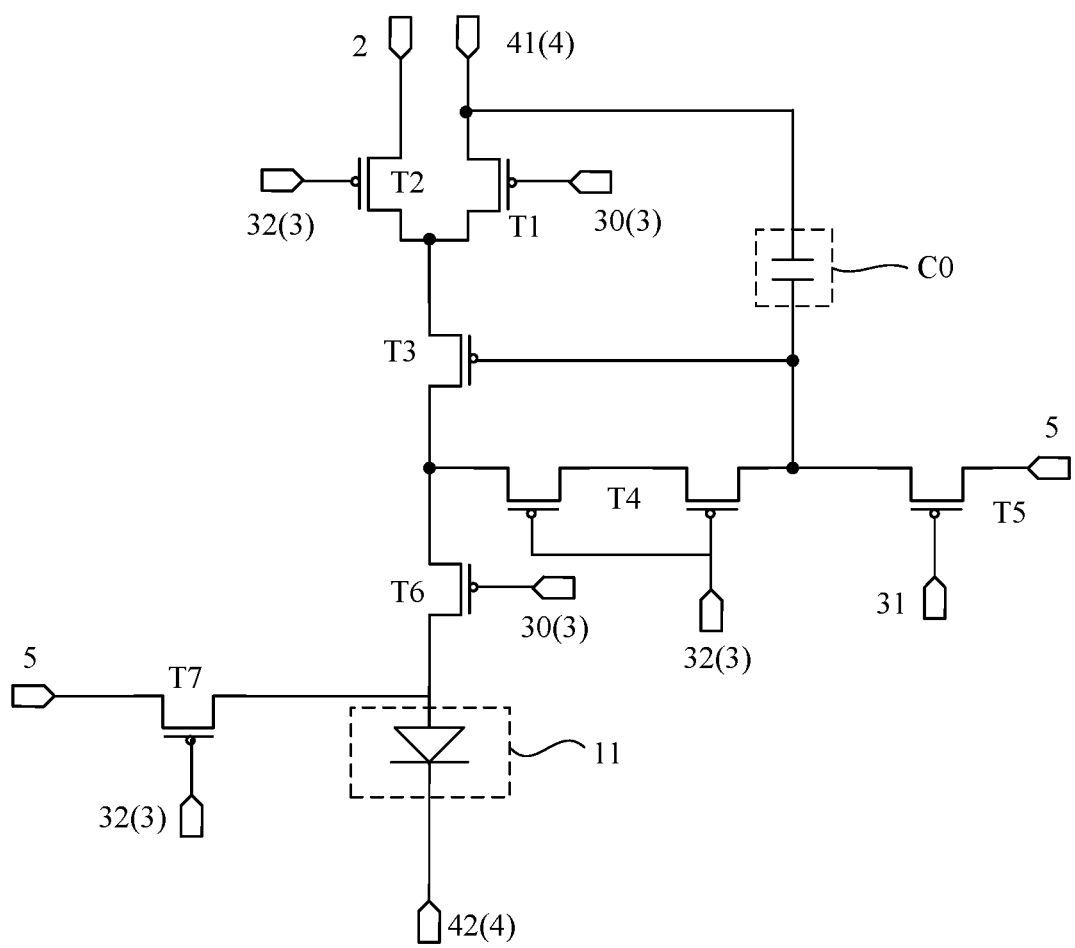
FIG. 3 is a schematic diagram of a circuit of a sub-pixel of a display panel provided by an embodiment of the present disclosure.
Figure 4:
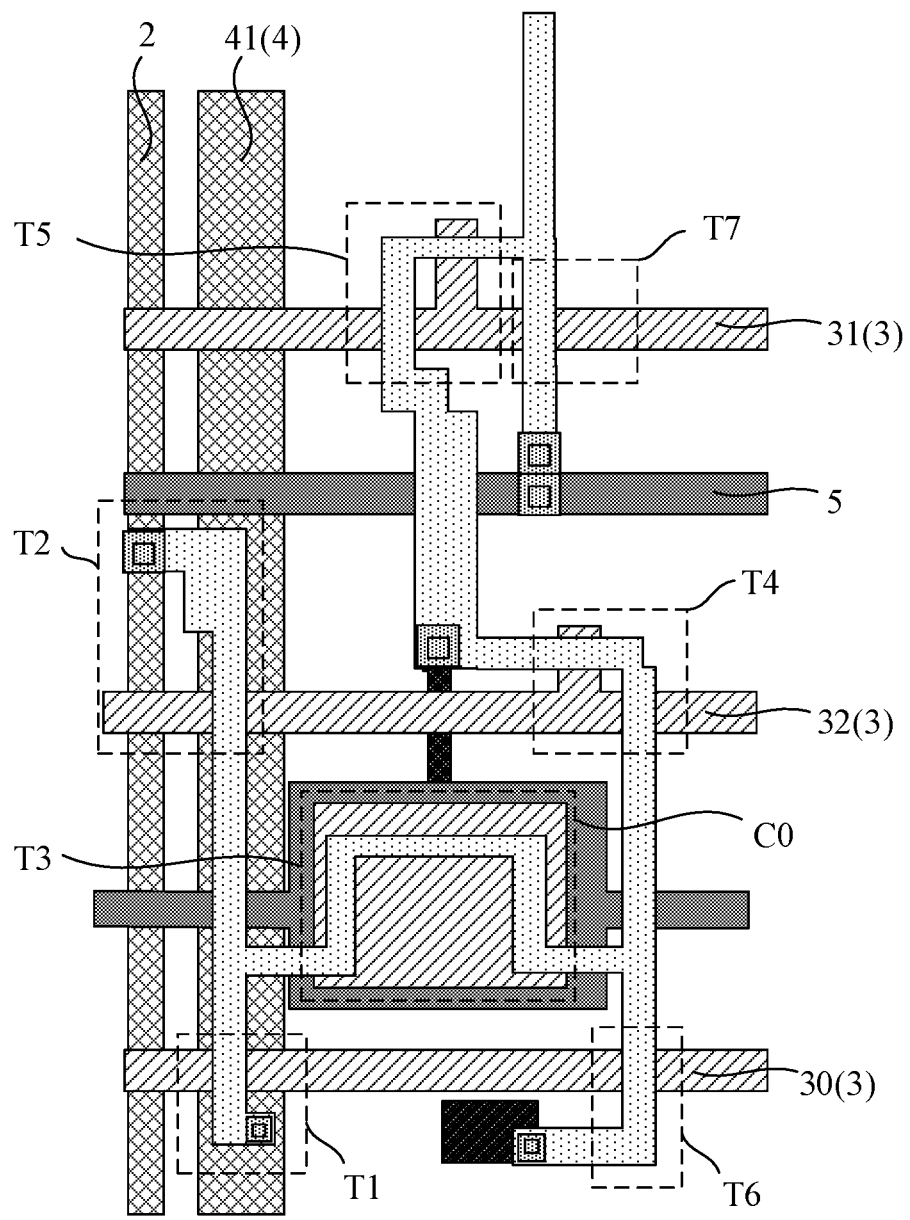
FIG. 4 is a schematic diagram of wiring of a pixel driving circuit shown in FIG. 3.

FIG. 3 is a schematic diagram of a circuit of a sub-pixel of a display panel provided by an embodiment of the present disclosure, and FIG. 4 is a schematic diagram of wiring of a pixel driving circuit shown in FIG. 3. As shown in FIG. 3 and FIG. 4, the pixel driving circuit includes a storage capacitor CO, a first transistor T1, a second transistor T2, a third transistor T3, a fourth transistor T4, a fifth transistor T5, a sixth transistor T6, and a seventh transistor T7. It should be noted that FIG. 4 is illustrated in a viewing angle from a side of the display panel facing away from emitting light towards a light-emitting side.

In an embodiment of the present disclosure, the display panel includes a plurality of signal lines located in the display area AA and electrically connected to the pixel driving circuits 12. According to the specific configuration of the pixel driving circuit, there are many ways to set the signal lines. Taking the pixel driving circuit shown in FIG. 3 and FIG. 4 as an example, the signal lines include data lines 2, scanning lines 3, power supply voltage signal lines 4, and a reference voltage line 5. For example, the scanning lines 3 include a first scanning line 31, a second scanning line 32, and a light-emitting control signal line 30. The power supply voltage signal lines 4 include a first power supply voltage signal line 41 and a second power supply voltage signal line 42 (not shown in FIG. 4).

The first transistor T1 includes a control terminal electrically connected to a corresponding light-emitting control signal line 30, and a first terminal electrically connected to the first power supply voltage signal line 41. The second transistor T2 includes a control terminal electrically connected to a corresponding second scanning line 32, and a first terminal electrically connected to a corresponding data line 2. The fourth transistor T4 includes a control terminal electrically connected to a corresponding second scanning line 32. The fifth transistor T5 includes a control terminal electrically connected to a corresponding first scanning line 31, and a first terminal electrically connected to the reference voltage line 5. The sixth transistor T6 includes a control terminal electrically connected to a corresponding light-emitting control signal line 30. The seventh transistor T7 includes a control terminal electrically connected to a corresponding second scanning line 32, and a first terminal electrically connected to the reference voltage line 5.

It should be noted that the structures of the pixel driving circuit shown in FIG. 3 and FIG. 4 are only for illustration, and the pixel driving circuit can also be designed in other forms in other embodiments of the present disclosure. For example, the pixel driving circuit 12 can be designed as other forms, such as a 2T1C form including two thin film transistors and one storage capacitor. Embodiments of the present disclosure does not limit the specific structure of the pixel driving circuit 12.

For example, in an embodiment of the present disclosure, as shown in FIG. 2, multiple data lines 2 are arranged along a first direction x, and each data line 2 extends along a second direction y, and the first direction x and the second direction y intersect each other.

As shown in FIG. 2, in an embodiment of the present disclosure, the pixel driving circuits 12 can be arranged in an array along the first direction x and the second direction y. With such configuration, the pixel driving circuits 12 are arranged more compactly, which is beneficial to improve the space utilization of the display panel and the resolution of the display panel.

In an embodiment, as shown in FIG. 2, one data line 2 is connected to multiple pixel driving circuits 12. For example, the multiple pixel driving circuits 12 connected to one data line 2 can be arranged along the second direction y.

For example, the display area AA of the display panel includes an irregularly shaped display area. The irregularly display area is in an irregular rectangle shape. For example, the shape of the irregularly shaped display area includes a circle, an ellipse, or a rounded rectangle shown in FIG. 1.

In an embodiment, when the display panel is designed in the rounded shape shown in FIG. 1, in order to match the shape design of the irregularly shaped display area, as shown in FIG. 2, the pixel driving circuits 12 located on the edge of the display area AA can be set according to the rule shown in FIG. 2. The arrangement of the pixel driving circuits 12 close to the edge of the display area AA is in a step-shape at the microscopic level. For example, in an embodiment of the present disclosure, a length of each step along the first direction x can be an integer multiple of a length of the pixel unit 1, and a height of the step can be an integer multiple of a height of the pixel driving circuit 12.

In an embodiment of the present disclosure, as shown in FIG. 2, the data lines 2 include at least a first data line 21, a second data line 22 and a third data line 23, the first data line 21 is electrically connected to M sub-pixels, the second data line 22 is electrically connected to M sub-pixels, and the third data line 23 is electrically connected to N sub-pixels, where 1≤M<N, and M and N are both integers.

For example, as shown in FIG. 2, the first data line 21 and the second data line 22 are adjacent to each other and arranged at a same side of the third data line 23. The first data line 21 or the second data line 22 is adjacent to the third data line 23, with respect to the pixel driving circuit 12 connected to the third data line 23, the pixel driving circuit 12 connected to the first data line 21 is retracted toward an inner side of the display area AA by a certain distance in the second direction; and with respect to the pixel driving circuit 12 connected to the third data line 23, the pixel driving circuit 12 connected to the second data line 22 is also retracted toward the inner side of the display area AA by a certain distance in the second direction. That is, the step is correspondingly formed by the edge of the pixel drive circuit 12 connected to the first data line 21, the edge of the pixel drive circuit 12 connected to the second data line 22, and the edge of the pixel drive circuit 12 connected to the third data line 23. A length H of a single step in the second direction y and a length h of one pixel driving circuit 12 in the second direction y satisfy: H≤(N−M)h.

Embodiments of the present disclosure can adjust the number of the steps, the length of a single step in the first direction x, and the length of the single step in the second direction y according to the shape design requirements of the irregularly shaped display panel. For example, when the edge of the display area AA (the edge of the display area AA is defined by the light-emitting unit) is designed as a curve, embodiments of the present disclosure can adjust the number of the steps, and the lengths of a single step in the first direction x and the second direction y according to a curvature of the irregular edge.

As shown in FIG. 2, in an embodiment of the present disclosure, the non-display area NA includes a first non-display area NA1 and a second non-display area NA2.

The display panel includes compensation capacitor groups 6 located in the first non-display area NA1, and the compensation capacitor group 6 is electrically connected to at least one data line 2 located in the display area AA, and is configured to balance a load difference between different data lines 2.

The display panel includes a peripheral circuit 7 located in the second non-display area NA2. For example, the peripheral circuit 7 includes at least one of a peripheral signal line, a scan driving circuit, an emission driving circuit, a touch circuit, or an electrostatic protection circuit. The peripheral circuit 7 can be arranged according to an arrangement of the edge of the display area AA.

In an embodiment of the present disclosure, the second non-display area NA2 at least partially surrounds the display area AA, and the first non-display area NA1 is located between the display area AA and the second non-display area NA2. The first non-display area NA1 corresponds to the steps. Each first non-display area NA1 has a length $L_y$ in the second direction y that gradually decreases along a direction parallel to the first direction x and along a direction from the display area AA to the second non-display area NA2. The length $L_y$ of the first non-display area NA1 in the second direction y is a distance, in the second direction y, between the pixel driving circuit 12 and the peripheral circuit 7 located at both sides of the first non-display area NA1. The compensation capacitor group 6 located in the first non-display area NA1 is not in contact with the peripheral circuit 7 located in the second non-display area NA2 and the pixel driving circuit 12 located in the display area AA. That is, a gap is formed between the compensation capacitor group 6 and the peripheral circuit 7, and a gap is also formed between the compensation capacitor group 6 and the pixel driving circuit 12. Such configuration can prevent the compensation capacitor group 6 and the peripheral circuit 7 from being short-circuited, as well as prevent the compensation capacitor group 6 and the pixel driving circuit 12 from being short-circuited. In other words, in embodiments of the present disclosure, the pixel driving circuit 12 and the peripheral circuit 7 define the area of the first non-display area NA1 where the compensation capacitor group 6 is located.

Referring to FIG. 2, the compensation capacitor group 6 includes at least a first compensation capacitor 61 and a second compensation capacitor 62. The first compensation capacitor 61 is electrically connected to the first data line 21, and the second compensation capacitor 62 is electrically connected to the second data line 22. The first compensation capacitor 61 has a capacitance $C_{61}$ same as a capacitance $C_{62}$ of the second compensation capacitor 62. The first compensation capacitor 61 is configured to balance a difference between a load of the first data line 21 and a load of the third data line 23. The second compensation capacitor 62 is configured to balance a difference between a load of the second data line 22 and a load of the third data line 23. It should be noted that the same capacitance refers to that these capacitances are substantially equal within an allowable range of a process error. For example, within a certain process error range, when $|C_{61}-C_{62}|/C_{61} \le 10\%$, the first compensation capacitor 61 and the second compensation capacitor 62 can also be regarded as the same.

In an embodiment, the third data line 23 may not be connected to the compensation capacitor.

In an embodiment of the present disclosure, the capacitance of the first compensation capacitor 61 and the second compensation capacitor 62 are related to the difference between M and N. When the difference between M and N is large, the capacitances of the first compensation capacitor 61 and the second compensation capacitor 62 are relatively large. When the difference between M and N is small, the capacitances of the first compensation capacitor 61 and the second compensation capacitor 62 are relatively small.

As shown in FIG. 2, in an embodiment of the present disclosure, the number of the steps can be greater than or equal to two. Correspondingly, the number of the first non-display area NA1 can be greater than or equal to two. The number of the compensation capacitor groups 6 including the first compensation capacitor 61 and the second compensation capacitor 62 can also be greater than or equal to two. FIG. 2 illustrates that four steps are arranged on the edge of the irregularly shaped display area, that is, FIG. 2 is a schematic diagram illustrating that four first non-display areas NA1 are arranged at rounded corners of the display panel and are connected in sequence. For example, the capacitances of the compensation capacitors located in a same first non-display area NA1 are the same. For different compensation capacitor groups 6 corresponding to different first non-display areas NA1, the compensation capacitors located in different compensation capacitor groups 6 can have different capacitances.

In the display panel provided by embodiments of the present disclosure, by setting the shape of the first non-display area NA1, the length $L_y$ of the display area NA1 in the second direction y gradually decreases along the first direction x and along a direction from the display area AA to the second non-display area NA2, so that the display panel can have different irregular shapes to meet different needs of users.

In an embodiment of the present disclosure, the compensation capacitor group 6 including the first compensation capacitor 61 and the second compensation capacitor 62 is arranged in the first non-display area NA1. The first compensation capacitor 61 and the second compensation capacitor 62 that are located in a same compensation capacitor group 6 have a same capacitance, which can match the difference between the loads of different data lines 2 in the irregularly shaped display panel and thus is beneficial to improve the display uniformity of the display panel.

As shown in FIG. 2, the first data line 21 can be arranged at a side of the second data line 22 close to the second non-display area NA2. Accordingly, a part of the first compensation capacitor 61 is located at a side of the second compensation capacitor 62 close to the second non-display area NA2. In the following, unless otherwise specified, the embodiments of the present disclosure will be described by taking the first compensation capacitor 61 being located at the side of the second compensation capacitor 62 close to the second non-display area NA2 as an example.

Figure 5:
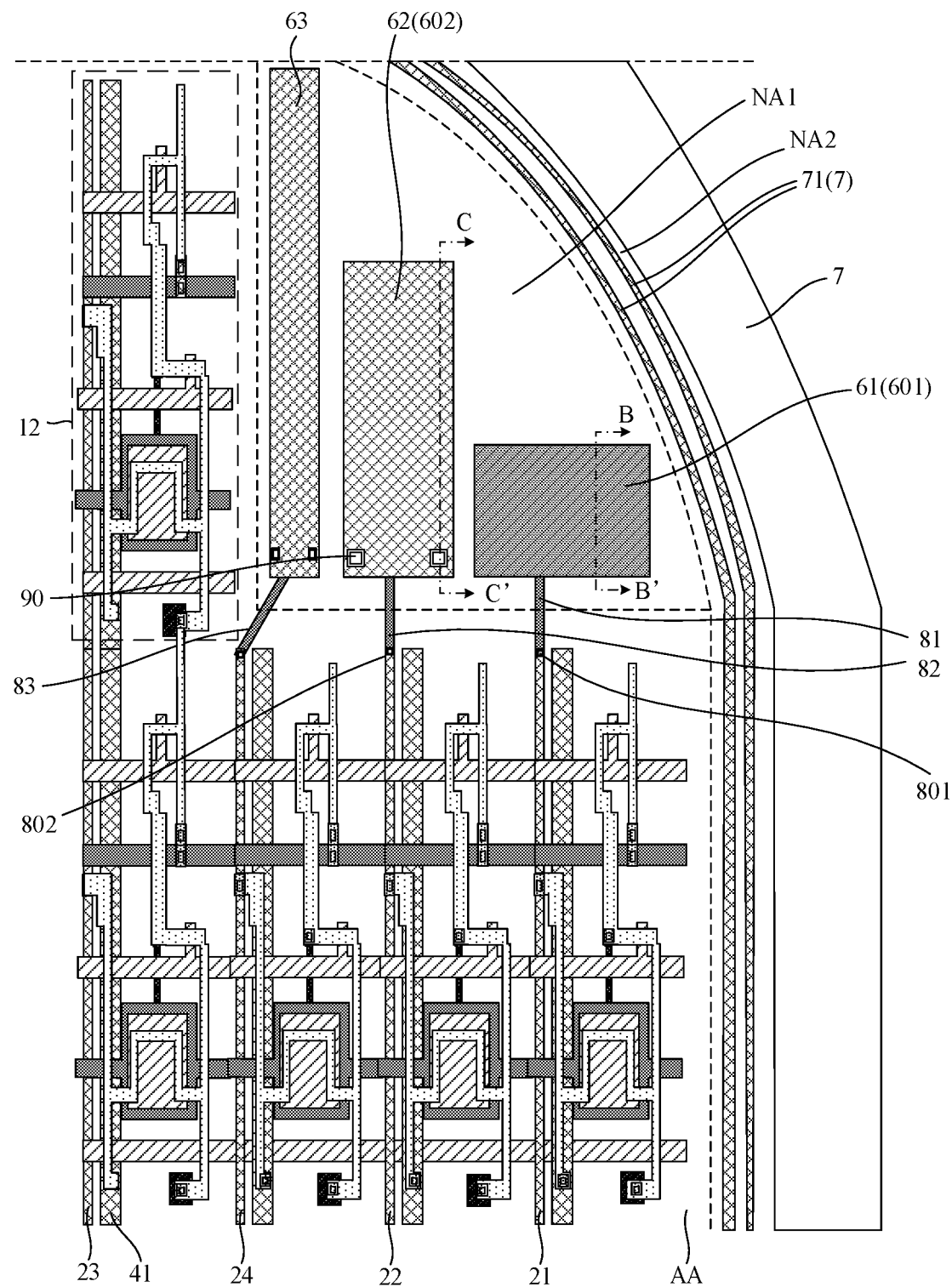
FIG. 5 is an enlarged diagram of a partial area of a display panel provided by an embodiment of the present disclosure.
Figure 6:
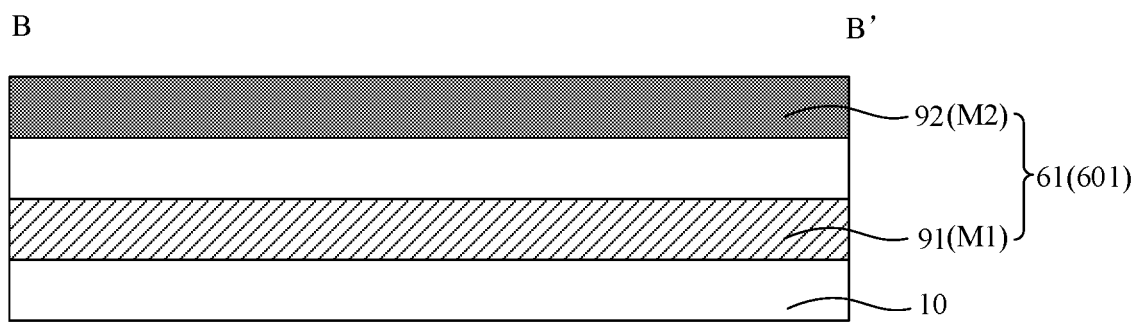
FIG. 6 is a cross-sectional view along line BB' shown in FIG. 5.

FIG. 5 is an enlarged diagram of a partial area of a display panel provided by an embodiment of the present disclosure, and FIG. 6 is a cross-sectional view along BB' shown in FIG. 5. As shown in FIG. 5 and FIG. 6, the first compensation capacitor 61 can be adjacent to the peripheral circuit 7. The first compensation capacitor 61 includes a first type of compensation capacitor 601. The first type of compensation capacitor 601 includes a first electrode 91 and a second electrode 92 that are stacked in a thickness direction of the display panel. The first electrode 91 and the second electrode 92 overlap in the thickness direction of the display panel. It should be noted that FIG. 5 is a schematic diagram of the display panel viewed from a side of the display panel away from emitting light. In FIG. 6, the upper side is a light-emitting side of the display panel, and the lower side is a side of the display panel away from the emitting light.

For example, as shown in FIG. 6, in an embodiment of the present disclosure, the first electrode 91 can be located on a side of the second electrode 92 facing towards the substrate 10.

In an embodiment of the present disclosure, the second electrode 92 can be electrically connected to the first data line 21, so that the second electrode 92 can transmit a corresponding data signal. As shown in FIG. 5, the second electrode of the first compensation capacitor 61 is connected to the first data line 21 through a first capacitor connection line 81.

For example, in an embodiment of the present disclosure, the first electrode 91 can be connected to a fixed signal. In an embodiment, the first electrode 91 can be connected to a first power supply voltage signal PVDD transmitted by the first power supply voltage signal line 41, a second power supply voltage signal PVEE transmitted by the second power supply voltage signal line 42, a fixed high voltage level signal VGH, or a fixed low voltage level signal VGL.

With reference to FIG. 4, FIG. 5 and FIG. 6, in an embodiment of the present disclosure, the first electrode 91 is located in a same layer as the scanning line 3 located in the display area AA. The layer where the scanning line 3 is located is a first metal layer M1. The first electrode 91 transmits a signal different from the scanning line 3. For example, the first electrode 91 can be electrically connected to a fixed signal line of the display panel through a via to receive a fixed signal.

In an embodiment of the present disclosure, the second electrode 92 can be arranged in a same layer as the reference voltage line 5 of the display panel. The layer where the reference voltage line 5 is located is a second metal layer M2. For example, the second electrode 92 can be electrically connected to the first data line 21 of the display panel through a via to receive a corresponding data signal.

In an embodiment of the present disclosure, two layers of electrode plates forming the first type of compensation capacitor 601 are respectively arranged in same layers as the original layers of the display panel, and the structures arranged in a same layer can be formed by a same patterning process, which can simplify the manufacturing process of the display panel.

In an embodiment, in the display area AA, the first data line 21 is located in the third metal layer M3. The third metal layer M3 is located on a side of the second metal layer M2 facing away from a substrate of the display panel. In an embodiment of the present disclosure, the first capacitor connection line 81 and the second electrode 92 can be arranged in a same layer, that is, the first capacitor connection line 81 is located in the second metal layer M2. As shown in FIG. 5, the first capacitor connection line 81 and the first data line 21 that are located in different metal layers can be electrically connected to each other through a via 801.

In embodiments of the present disclosure, the first compensation capacitor 61 close the second non-display area NA2 only includes the first type of compensation capacitor 601 composed of two layers of electrode plates, so that there is no need to change the manufacturing process of the peripheral circuit 7 while the first compensation capacitor 61 and the peripheral circuit 7 are not short-circuited, which is beneficial to reduce the manufacturing process difficulty of the display panel. As shown in FIG. 5, the peripheral circuit 7 includes a peripheral signal line 71 close to a side of the display area AA, and the peripheral signal line 71 is electrically connected to a thin film transistor of the peripheral circuit 7. In an embodiment of the present disclosure, the peripheral signal line 71 can be disposed in a third metal layer M3. In embodiments of the present disclosure, it is avoided that the electrode plates of the first type of compensation capacitor 601 are arranged in the third metal layer M3. In this way, it can be ensured that the first compensation capacitor 61 and the peripheral signal line 71 are not in contact with each other, and a distance between the first compensation capacitor 61 and the second non-display areas NA2 is reduced, which on the one hand, is beneficial to increase the area of opposite electrodes of the first compensation capacitor 61, and on the other hand, is beneficial to reduce the requirements on process accuracy.

For example, a signal transmitted by the peripheral signal line 71 can be at least one of the fixed high voltage level signal VGH or the fixed low voltage level signal VGL.

Figure 7:
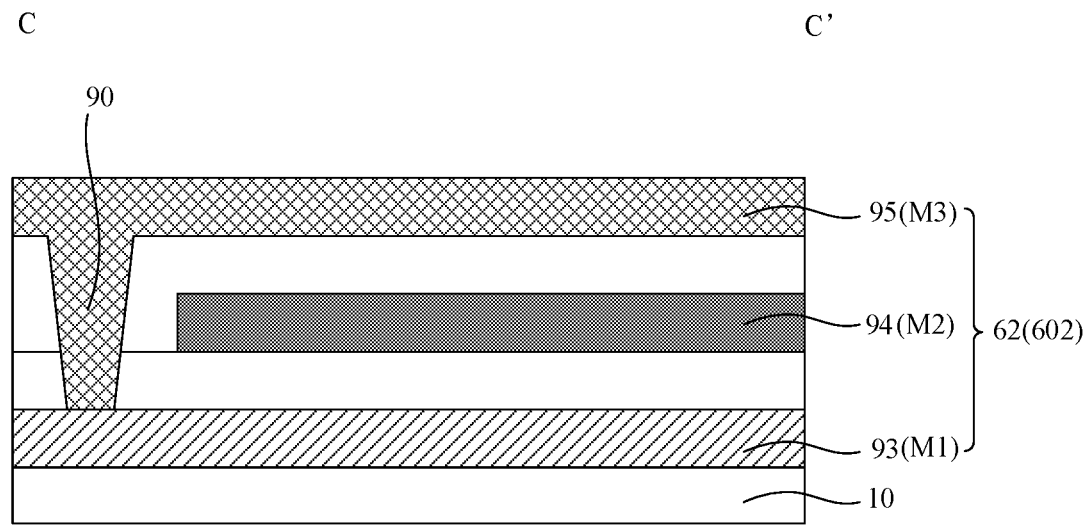
FIG. 7 is a cross-sectional view along line CC' shown in FIG. 5.

FIG. 7 is a cross-sectional view along line CC' shown in FIG. 5. As shown in FIG. 5 and FIG. 7, the second compensation capacitor 62 includes a second type of compensation capacitor 602, and the second type of compensation capacitor 602 includes a third electrode 93, a fourth electrode 94, and a fifth electrode 95 that are stacked in the thickness direction of the display panel. The fourth electrode 94 is located between the third electrode 93 and the fifth electrode 95. The third electrode 93, the fourth electrode 94, and the fifth electrode 95 overlap in the thickness direction of the display panel. The upper part in FIG. 7 is the light-emitting side of the display panel, and the lower part is the side of the display panel away from the emitting light.

As shown in FIG. 7, in an embodiment of the present disclosure, the fourth electrode 94 can be located on a side of the third electrode 93 facing away from the substrate 10.

In an embodiment of the present disclosure, the fourth electrode 94 can be electrically connected to the second data line 22, and the fourth electrode 94 can transmit a corresponding data signal. As shown in FIG. 5, the fourth electrode of the second compensation capacitor 62 is connected to the second data line 22 through the second capacitor connection line 82.

In an embodiment of the present disclosure, both the third electrode 93 and the fifth electrode 95 can be connected to a fixed signal. In an embodiment, each of the third electrode 93 and the fifth electrode 95 can be connected to any one of the first power supply voltage signal PVDD, the second power supply voltage signal PVEE, the fixed high voltage level signal VGH, or the fixed low voltage level signal VGL.

In an embodiment, in combination with FIG. 6 and FIG. 7, the third electrode 93 and the first electrode 91 can be arranged in a same layer. That is, the first electrode 91, the third electrode 93, and the scanning line 3 that is located in the display area AA are all located in the first metal layer M1. The third electrode 93 transmits a signal different from a signal transmitted by the scanning line 3. For example, the third electrode 93 can be electrically connected to a fixed signal line of the display panel through a via to receive a fixed signal.

In an embodiment of the present disclosure, the fourth electrode 94 and the second electrode 92 can be arranged in a same layer. That is, the second electrode 92, the fourth electrode 94, and the reference voltage line 5 that is located in the display area AA are all located in the second metal layer M2. For example, the fourth electrode 94 can be electrically connected to the second data line 22 of the display panel through a via to receive a corresponding data signal.

In an embodiment of the present disclosure, the fifth electrode 95 and the data line 2 that is located in the display area AA can be arranged in a same layer. The fifth electrode 95 transmits a signal different from a signal transmitted by the data line 2. For example, the fifth electrode 95 can be electrically connected to a fixed signal line of the display panel through a via to receive a fixed signal. In an embodiment, the fifth electrode 95 can also be disposed in another metal layer to be electrically connected to a fixed signal line of the display panel through a via to receive a fixed signal, which is not limited in the present disclosure.

In an embodiment of the present disclosure, the arrangement of the second type of compensation capacitor 602 can enable the second compensation capacitor 62 to have a relatively large capacitance in a limited plane space. In an embodiment of the present disclosure, three layers of electrode plates constituting the second-type compensation capacitor 602 are arranged in the same layers as original layers of the display panel, and the structures arranged in the same layer can be formed by a same patterning process, which can simplify the manufacturing process of the display panel.

In an embodiment of the present disclosure, the third electrode 93 and the fifth electrode 95 can be connected to a same fixed signal. As shown in FIG. 5 and FIG. 7, in an embodiment of the present disclosure, the third electrode 93 and the fifth electrode 95 can be electrically connected to each other through a via 90.

In the display area AA, the second data line 22 is located in the third metal layer M3. In an embodiment of the present disclosure, the second capacitor connection line 82 can be located in the second metal layer M2. As shown in FIG. 5, the second capacitor connection line 82 and the second data line 22 that are respectively located in different metal layers can be connected to each other through a via 802.

Figure 8:
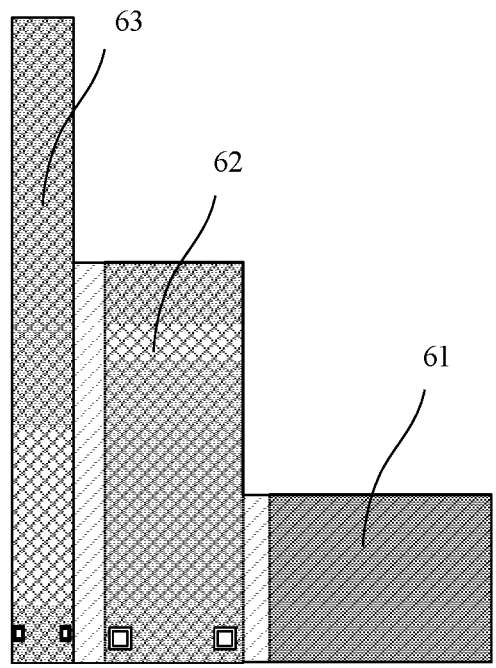
FIG. 8 is an enlarged diagram of a first non-display area provided by an embodiment of the present disclosure.
Figure 9:
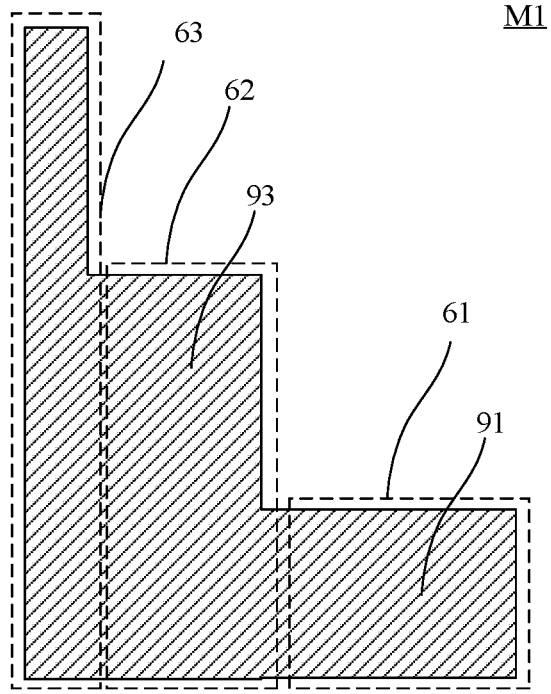
FIG. 9 is a schematic diagram of a first metal layer M1 shown in FIG. 8.

FIG. 8 is another enlarged diagram of a first non-display area provided by an embodiment of the present disclosure, and FIG. 9 is a schematic diagram of a first metal layer M1 shown in FIG. 8. As shown in FIG. 8 and FIG. 9, the first electrode 91 of the first compensation capacitor 61 and the third electrode 93 of the second compensation capacitor 62 can be electrically connected to each other to transmit a same fixed signal.

Figure 10:
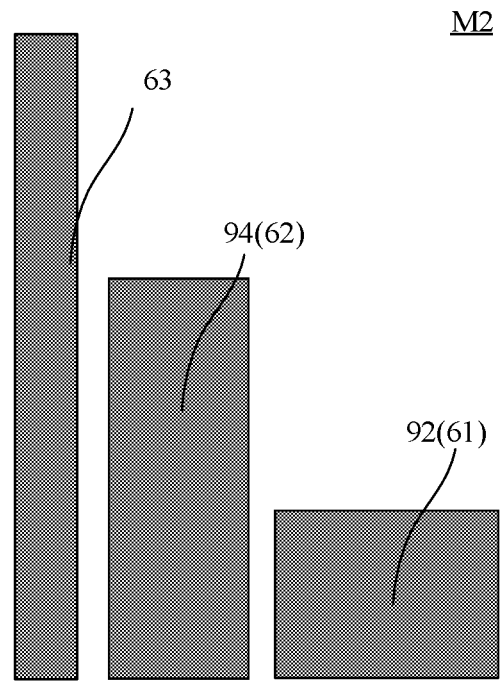
FIG. 10 is a schematic diagram of a second metal layer M2 shown in FIG. 8.

FIG. 10 is a schematic diagram of a second metal layer M2 shown in FIG. 8. As shown in FIG. 8 and FIG. 10, the second electrode 92 and the fourth electrode 94 that are respectively electrically connected to different data lines can be spaced from each other by a certain distance, and the second electrode 92 of the first compensation capacitor 61 and the fourth electrode 94 of the second compensation capacitor 62 may not be connected to each other.

Figure 11:
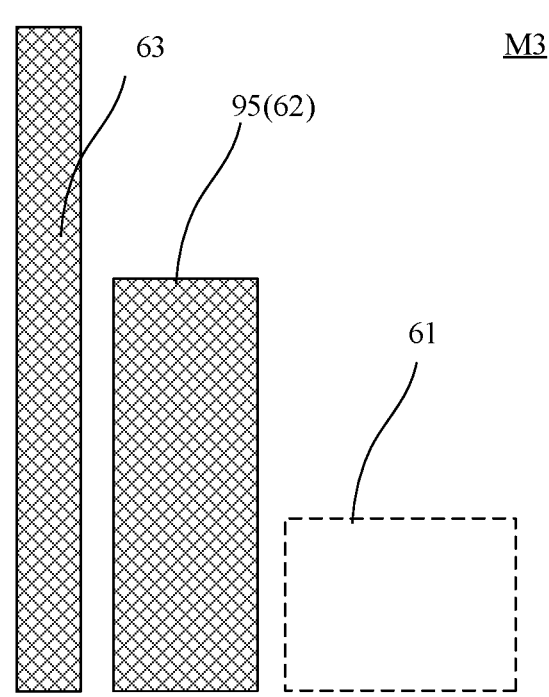
FIG. 11 is a schematic diagram of a third metal layer M3 shown in FIG. 8.

FIG. 11 is a schematic diagram of a third metal layer M3 shown in FIG. 8. As shown in FIG. 8 and FIG. 11, no pattern is formed at the first compensation capacitor 61 in the metal layer M3, so that the first compensation capacitor 61 is formed by the first type of compensation capacitor with the two layers of electrode plates.

In an embodiment, the first compensation capacitor 61 can also be configured as a second type of compensation capacitor 602 including three layers of electrode plates, so as to increase the capacitance of the first compensation capacitor 61 in a limited plane space.

Unless otherwise specified below, the shapes of the compensation capacitors mentioned in the text of the specification and shown in the drawings of the specification are the shapes of the opposite electrodes of the corresponding compensation capacitors.

Figure 12:
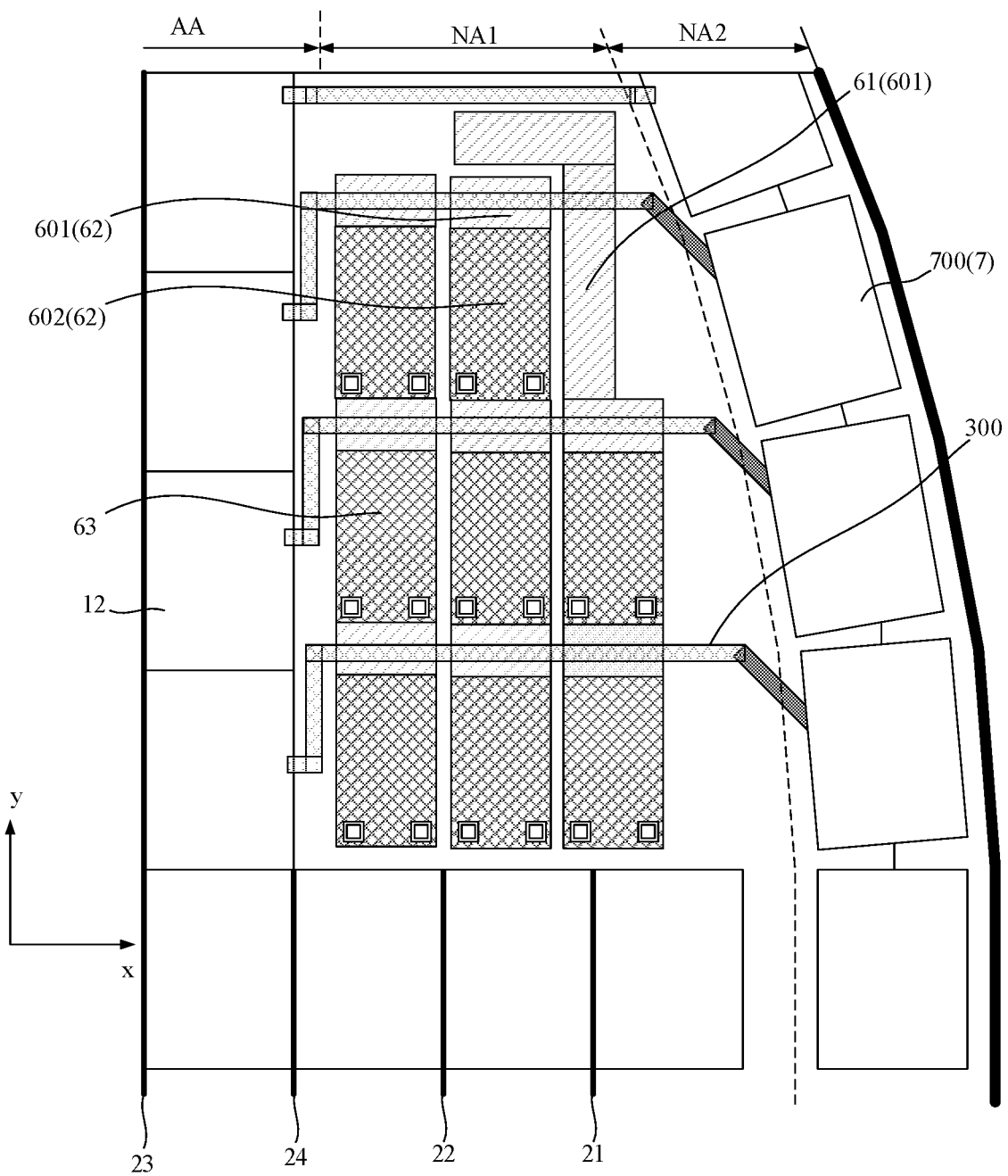
FIG. 12 is another enlarged diagram of a partial area of a display panel provided by an embodiment of the present disclosure.

FIG. 12 is another enlarged diagram of a first non-display area provided by an embodiment of the present disclosure. As shown in FIG. 12, when the peripheral circuit 7 includes a scan driving circuit, the scan driving circuit includes a plurality of cascaded shift register units 700. The display panel includes a scanning connection line 300 connecting the shift register unit 700 and the scanning line 3 in the first non-display area NA1.

As shown in FIG. 12, in an embodiment of the present disclosure, the first type of compensation capacitor 601 with two layers of electrode plates can also be provided in the second compensation capacitor 62. In the second compensation capacitor 62, the first type of compensation capacitor 601 and the second type of compensation capacitor 602 are connected in series to each other. With such configuration, the capacitance of the second compensation capacitor 62 can be increased to adapt to the situation where the difference between M and N is relatively large.

In an embodiment, as shown in FIG. 12, the first type of compensation capacitor 601 and the second type of compensation capacitor 602 of the second compensation capacitor 62 are arranged along the second direction y. Compared with the case where only the second type of compensation capacitor 602 is provided in the capacitor 62, this embodiment increases the length of the second compensation capacitor 62 in the second direction y. When the length of the second compensation capacitor 62 in the second direction y is relatively large, the first type of compensation capacitor 601 and the scanning connection line 300 can overlap each other, and the second type of compensation capacitor 602 and the scanning connection line 300 may not overlap each other. In an embodiment, the scanning connection line 300 can be disposed in the third metal layer M3. The signal transmitted by the scanning connection line 300 is a non-constant signal, which is switched between an effective voltage level and an ineffective voltage level. Under the effective voltage level, the corresponding thin film transistor of the pixel driving circuit 12 is turned on. Under the ineffective voltage level, the corresponding thin film transistor of the pixel driving circuit 12 is turned off.

In an embodiment of the present disclosure, a first type of compensation capacitor 601 with two layers of electrode plates is arranged in the second compensation capacitor 62, and the first type of compensation capacitor 601 and the scanning connection line 300 overlap, thereby increasing the capacitance of the second compensation capacitor 62 and reasonably and effectively utilizing original layers of the display panel without adding a new layer.

In an embodiment, as shown in FIG. 12, the first type of compensation capacitors 601 and the second type of compensation capacitors 602 of the second compensation capacitor 62 are alternately arranged along the second direction y.

In the second compensation capacitor 62, an area of an orthographic projection of the first type of compensation capacitor 601 on the plane of the display panel is smaller than an area of an orthographic projection of the second type of compensation capacitor 602 on the plane of the display panel. Such configuration can increase the area of the second type of compensation capacitor 602 with three layers of electrode plates, which is beneficial to make the capacitance of the second compensation capacitor 62 as large as possible in a limited plane space.

When arranging the first compensation capacitor 61 and the second compensation capacitor 62 in a same compensation capacitor group 6, the embodiments of the present disclosure provide a variety of different design methods, which will be described as follows.

In an embodiment, the first compensation capacitor 61 and the second compensation capacitor 62 can at least partially overlap in the first direction x, and the first compensation capacitor 61 and the second compensation capacitor 62 can at least partially overlap in the second direction y. With such design, the lengths of the first non-display area NA1 in the first direction x and the second direction y can be reasonably utilized, so that the shape of the compensation capacitor at all positions can match the shape of the first non-display area NA1.

In an embodiment, in order to realize that the first compensation capacitor and the second compensation capacitor overlap both in the first direction x and the second direction y, at least one of the first compensation capacitor or the second compensation capacitor can include a first compensation sub-capacitor and a second compensation sub-capacitor that are connected in series to each other. A non-zero angle is formed by the first compensation sub-capacitor and the second compensation sub-capacitor at their connection position. That is, the shape of the orthographic projection of at least one of the first compensation capacitor or the second compensation capacitor include at least one corner. One of the first compensation capacitor and the second compensation capacitor includes the first compensation sub-capacitor overlapping with the other one of the first compensation capacitor and the second compensation capacitor in the second direction, and includes the second compensation sub-capacitor overlapping with the other one of the first compensation capacitor and the second compensation capacitor in the first direction.

Figure 13:
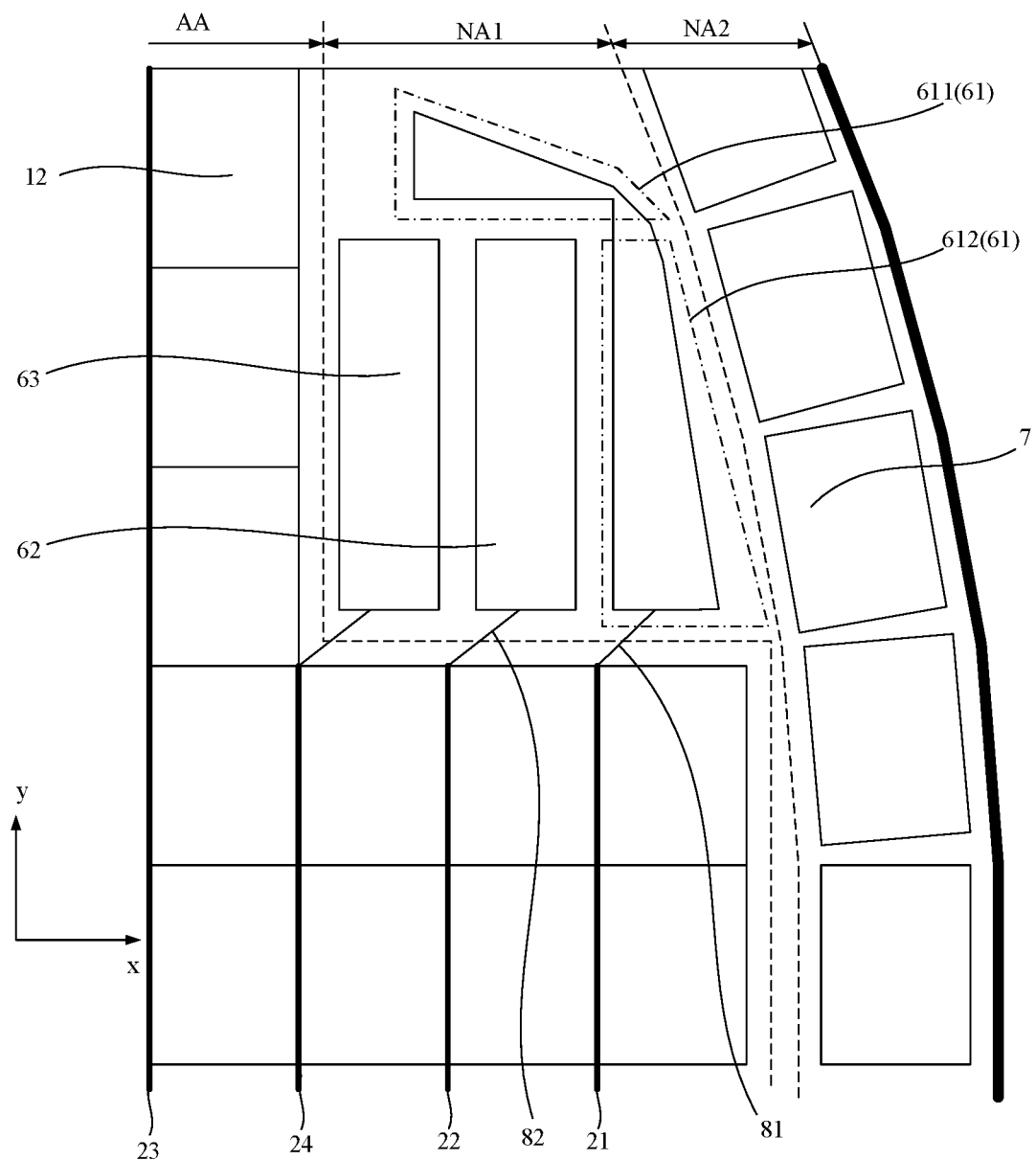
FIG. 13 is another enlarged diagram of a partial area of a display panel provided by an embodiment of the present disclosure.

FIG. 13 is another enlarged diagram of a partial area of a display panel provided by an embodiment of the present disclosure. As shown in FIG. 13, in an embodiment of the present disclosure, the first compensation capacitor 61 can include a first compensation sub-capacitor 611 and a second compensation sub-capacitor 612, the first compensation sub-capacitor 611 and the second compensation capacitor 62 at least partially overlap in the second direction y, and the second compensation sub-capacitor 612 and the second compensation capacitor 62 at least partially overlap in the first direction x. The second compensation sub-capacitor 612 is located at the side of the second compensation capacitor 62 close to the second non-display area NA2. The second compensation capacitor 62 has a shape with a single extending direction.

In FIG. 13, an opposite area $S_{62}$ of the electrode plates of the second compensation capacitor 62, an opposite area $S_{611}$ of the electrode plates of the first compensation sub-capacitor 611, and an opposite area $S_{612}$ of the electrode plates of the second compensation sub-capacitor 612 satisfies: $S_{62}=S_{611}+S_{612}$, so that the capacitance $C_{62}$ of the second compensation capacitor 62, the capacitance $C_{611}$ of the first compensation sub-capacitor 611, and the capacitance $C_{612}$ of the second compensation sub-capacitor 612 satisfy: $C_{62}=C_{611}+C_{612}$.

Based on the above configuration, while the first compensation capacitor 61 and the second compensation capacitor 62 have a same capacitance, the arrangement of the first compensation capacitor 61 and the second compensation capacitor 62 in the first non-display area NA1 can also be set to match the length $L_y$ of the first non-display area NA1 at different positions in the second direction y, which can improve the space utilization of the first non-display area NA1 at different positions.

As shown in FIG. 13, in an embodiment of the present disclosure, the shape of the second compensation capacitor 62 can be a rectangle, a maximum length of the second compensation sub-capacitor 612 in the first direction x is equal to the length of the second compensation capacitor 62 in the first direction x, and the length of the second compensation sub-capacitor 612 along the second direction y gradually decreases along a direction from the display area AA to the second non-display area NA2, to match a shape design in which the length $L_y$ of the first non-display area NA1 in the second direction y gradually decreases. It can be seen that in this case, the capacitance $C_{612}$ of the second compensation sub-capacitor 612 is smaller than the capacitance $C_{62}$ of the second compensation capacitor 62. On this basis, in embodiments of the present disclosure, the first compensation sub-capacitor 611 is provided, and the first compensation sub-capacitor 611 and the second compensation capacitor 62 overlap in the second direction y, and the capacitance difference between the second compensation capacitor 612 and the second compensation capacitor 62 that are arranged along the first direction x can be compensated utilizing the first compensation sub-capacitor 611. The length of the first non-display area NA1 along the second direction y at the second compensation capacitor 62 is greater than the length of the first non-display area NA1 along the second direction y at the second compensation sub-capacitor 612. Therefore, in embodiments of the present disclosure, the first compensation sub-capacitor 611 and the second compensation capacitor 62 overlap in the second direction y, and the space utilization of the first non-display area NA1 is increased utilizing the space of the first non-display area NA1 at a position where the second compensation capacitor 62 has a relatively large length.

Figure 14:
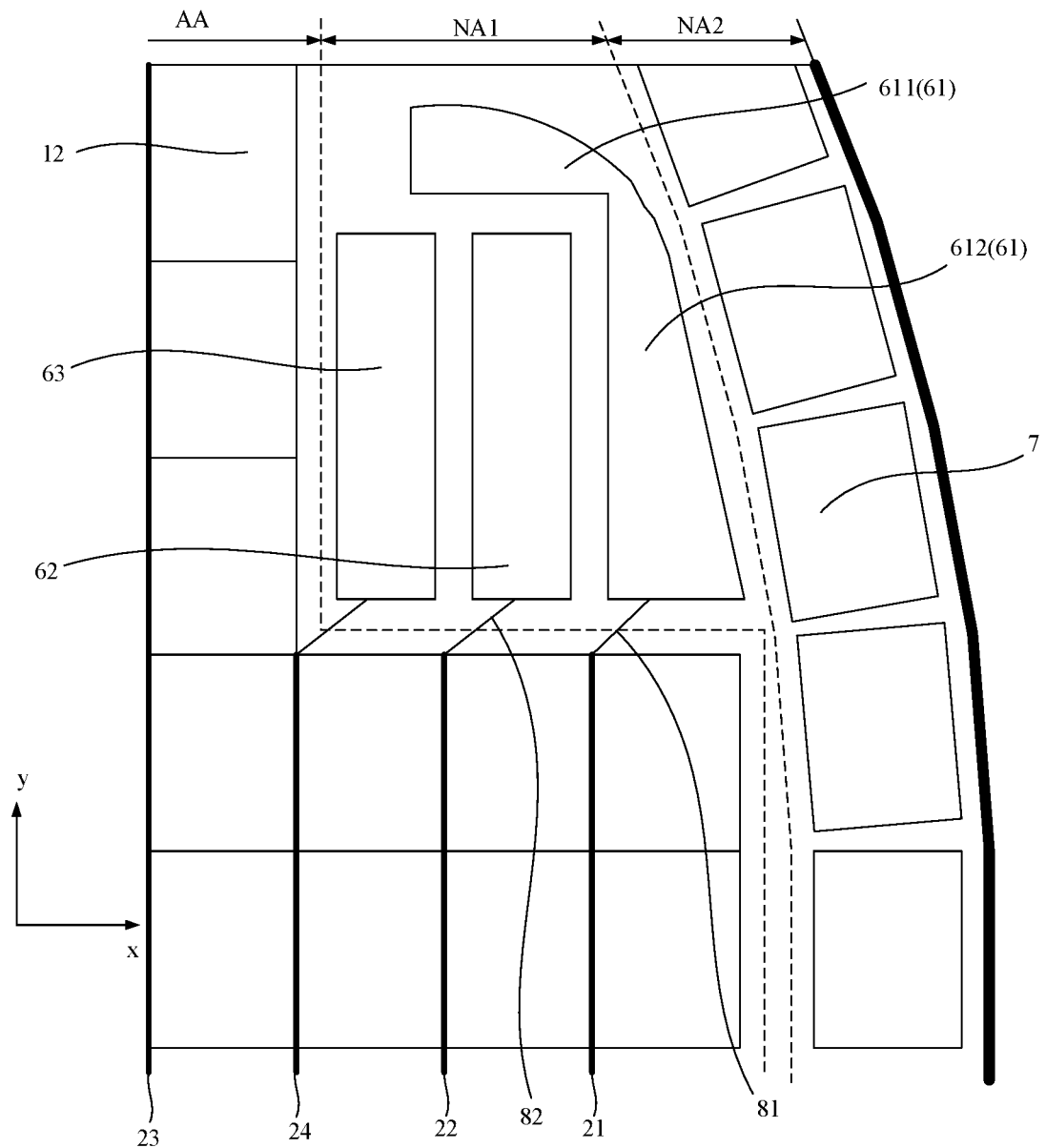
FIG. 14 is another enlarged diagram of a partial area of a display panel provided by an embodiment of the present disclosure.

For example, in order to match the shape of the first non-display area NA1, the shape of at least one of the first compensation sub-capacitor 611 or the second compensation sub-capacitor 612 can be designed to be triangular or trapezoidal, that is, the edge, close to the second non-display area NA2, of at least one of the first compensation sub-capacitor 611 or the second compensation sub-capacitor 612 is a straight line. FIG. 13 is a schematic diagram illustrating that the first compensation sub-capacitor 611 and the second compensation sub-capacitor 612 have a trapezoidal shape. FIG. 14 is another enlarged diagram of a partial area of a display panel provided by an embodiment of the present disclosure. In an embodiment of the present disclosure, as shown in FIG. 14, the edge of the first compensation capacitor 61 close to the second non-display area NA2 can be an arc-shaped edge.

It should be noted that the above embodiment only exemplarily illustrates that the maximum length of the second compensation sub-capacitor 612 in the first direction x is equal to the length of the second compensation capacitor 62 in the first direction x. In another embodiment of the present disclosure, the maximum length of the second compensation sub-capacitor 612 in the first direction x is smaller than the length of the second compensation capacitor 62 in the first direction x. In another embodiment, the maximum length of the second compensation sub-capacitor 612 in the first direction x can be greater than the length of the second compensation capacitors 62 in the first direction x, which is not limited in embodiments of the present disclosure.

In an embodiment, as shown in FIG. 13 and FIG. 14, in the second direction y, the first compensation sub-capacitor 611 can be disposed at the side of the second compensation capacitor 62 away from the display area AA, and the first compensation sub-capacitor 611 is connected to the first data line 21 through the second compensation sub-capacitor 612 and the first capacitor connection line 81, to prevent the second capacitor connection line 82 and the first compensation capacitor 61 from overlapping in the first direction x, and to avoid that the length of the second capacitor connection line 82 is creased due to the winding of the second capacitor connection line 82.

Figure 15:
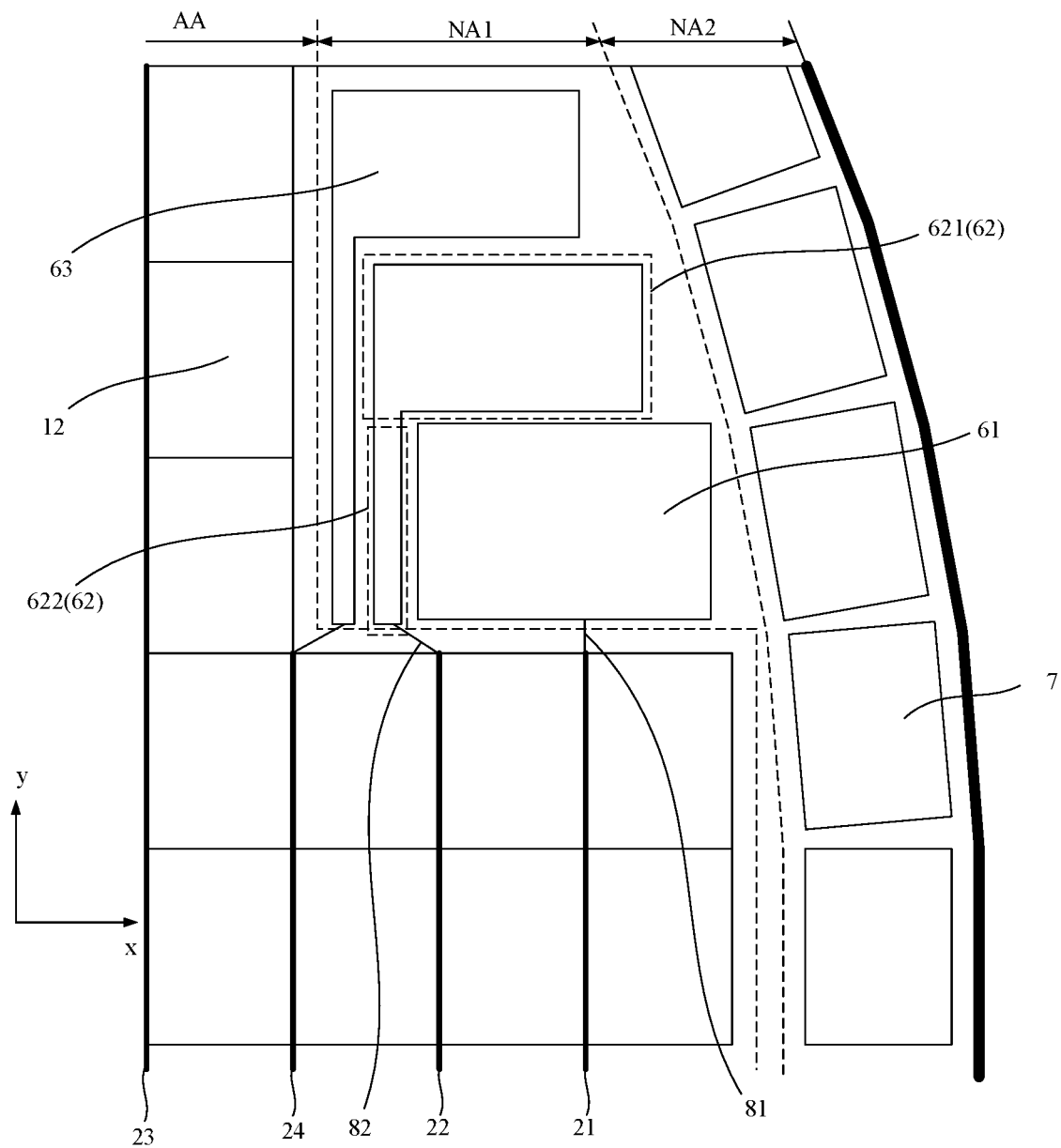
FIG. 15 is another enlarged diagram of a partial area of a display panel provided by an embodiment of the present disclosure.

FIG. 15 is another enlarged diagram of a partial area of a display panel provided by an embodiment of the present disclosure. In an embodiment of the present disclosure, as shown in FIG. 15, the second compensation capacitor 62 can also include the first compensation sub-capacitor and the second compensation sub-capacitor, and the first compensation capacitor 61 is configured to have a shape with a single extending direction. To show the distinction, the first compensation sub-capacitor of the second compensation capacitor 62 is marked as 621, and the second compensation sub-capacitor of the second compensation capacitor 62 is marked as 622. The first compensation sub-capacitor 621 and the first compensation capacitor 61 at least partially overlap in the second direction y, and the second compensation sub-capacitor 622 and the first compensation capacitor 61 at least partially overlap in the first direction x. The second compensation sub-capacitor 622 is located at a side of the first compensation capacitor 61 close to the display area AA.

An opposite area $S_{61}$ of the electrode plates of the first compensation capacitor 61, an opposite area $S_{621}$ of the electrode plates of the first compensation sub-capacitor 621, and an opposite area $S_{622}$ of the electrode plates of the second sub-compensating capacitor 622 satisfy: $S_{61}=S_{621}+S_{622}$, so that the capacitance $C_{61}$ of the first compensation capacitor 61, the capacitance $C_{611}$ of the first compensation sub-capacitor 621, and the capacitance $C_{612}$ of the second compensation sub-capacitor 622 satisfy: $C_{61}=C_{621}+C_{622}$.

In embodiments of the present disclosure, as shown in FIG. 15, a length $L_x$ of the first non-display area NA1 along the first direction x gradually decrease along the direction parallel to the second direction y and a direction from the display area AA to the second non-display area NA2. The length $L_x$ of the first non-display area NA1 along the first direction x is a distance between the peripheral circuit 7 and the pixel driving circuit 12 in the first direction x.

With the above configuration, while the first compensation capacitor 61 and the second compensation capacitor 62 have a same capacitance, the arrangement of the first compensation capacitor 61 and the second compensation capacitor 62 in the first non-display area NA1 can match the length $L_x$ of the first non-display area NA1 at different positions along the first direction x, which can improve the space utilization of the first non-display area NA1 at different positions.

In an embodiment, as shown in FIG. 15, the first compensation sub-capacitor 621 and the second compensation sub-capacitor 622 can have a rectangle shape.

In an embodiment, as shown in FIG. 15, the first compensation sub-capacitor 621 can be retracted towards the display area AA in the first direction x by a distance with respect to the first compensation capacitor 61. The retraction indicates that a distance between an edge of the first compensation sub-capacitor 621 away from the display area AA and the display area AA in the first direction x is smaller than a distance between an edge of the first compensation capacitor 61 away from the display area AA and the display area AA in the first direction x. Such configuration can match the shape of the first non-display area NA1.

Figure 16:
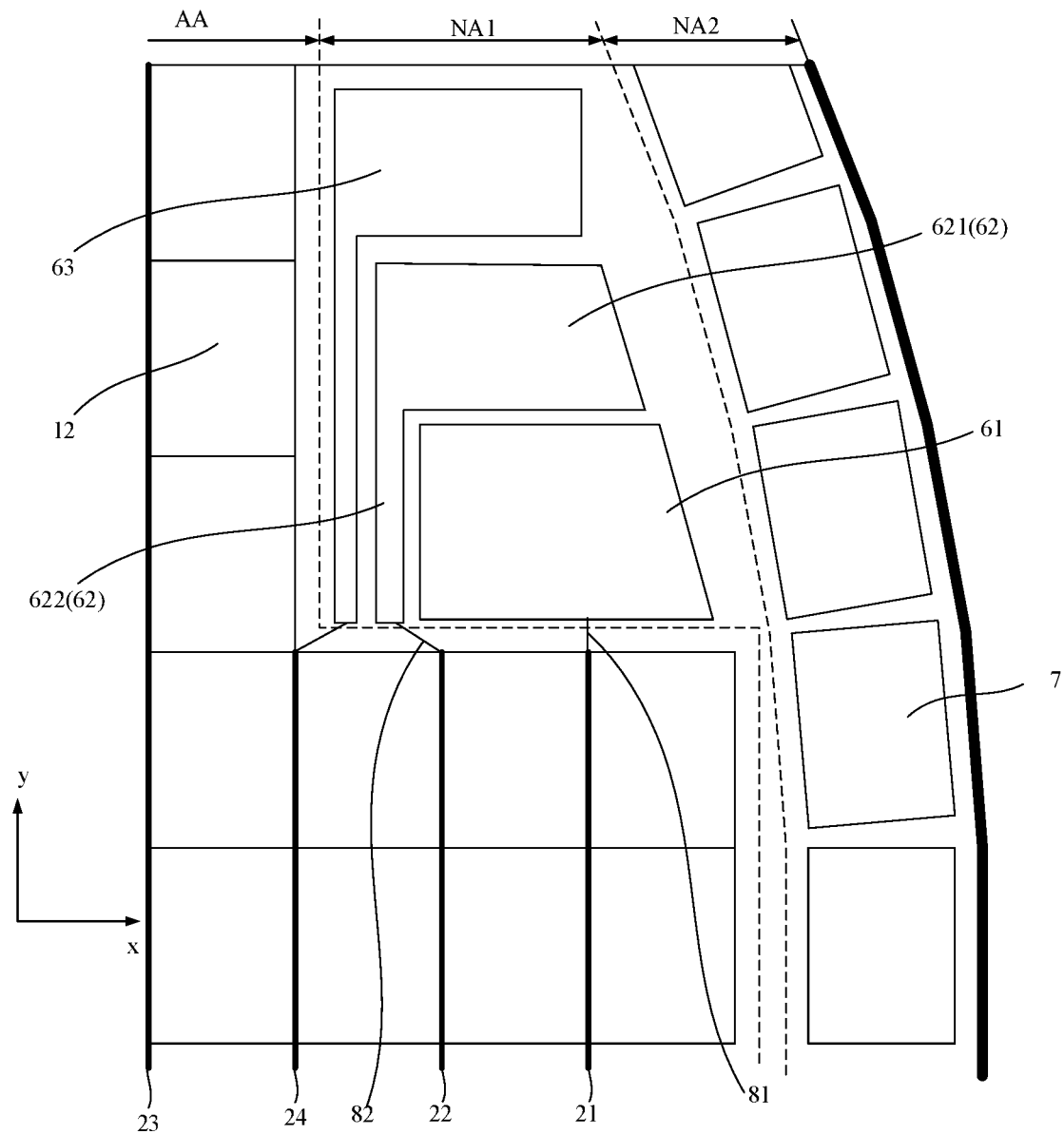
FIG. 16 is another enlarged diagram of a partial area of a display panel provided by an embodiment of the present disclosure.
Figure 17:
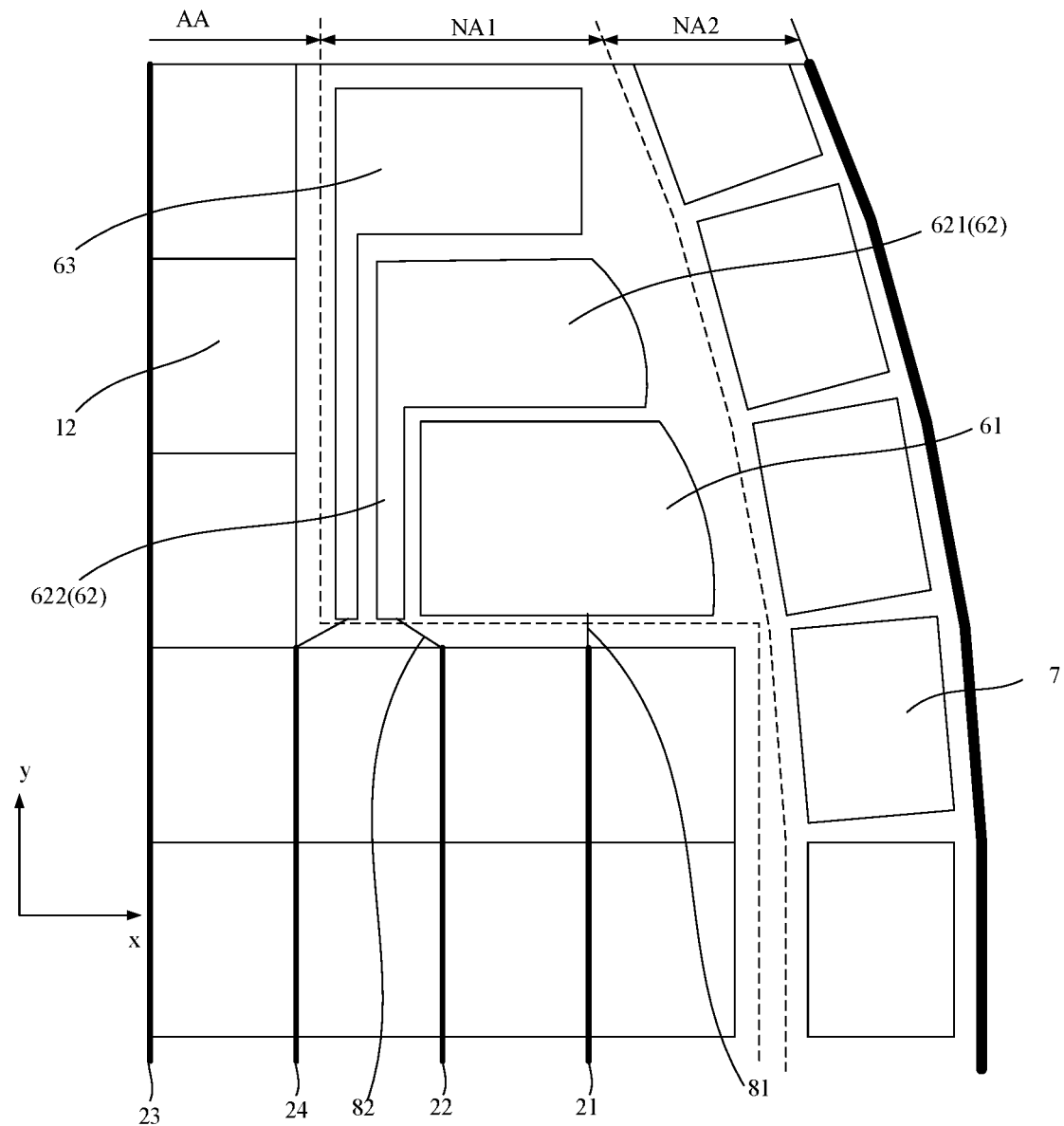
FIG. 17 is another enlarged diagram of a partial area of a display panel provided by an embodiment of the present disclosure.

In an embodiment of the present disclosure, along the direction from the display area AA to the second non-display area NA2, the length of at least one of the first compensation sub-capacitor 621 or the first compensation capacitor 61 gradually decreases in the second direction y, to match the shape of the first non-display area NA1. For example, in an embodiment of the present disclosure, the first compensation sub-capacitor 621 and the first compensation capacitor 61 can be triangular or trapezoidal. FIG. 16 is another enlarged diagram of a partial area of a display panel provided by an embodiment of the present disclosure. As shown in FIG. 16, the first compensation sub-capacitor 621 and the first compensation capacitor 61 have the shape of trapezoid. FIG. 17 is another enlarged diagram of a partial area of a display panel provided by an embodiment of the present disclosure. In an embodiment of the present disclosure, as shown in FIG. 17, the first compensation capacitor 61 and the second compensation capacitor 62 can have arched edge.

In an embodiment, based on the second compensation capacitor 62 having the shape shown in FIG. 15, FIG. 16, and FIG. 17, the length of the second compensation sub-capacitor 622 along the first direction x is smaller than the length of the first compensation capacitor 61 along the first direction x.

In an embodiment, as shown in FIG. 15, FIG. 16, and FIG. 17, in the second direction y, the first compensation sub-capacitor 621 can be disposed at a side of the first compensation capacitor 61 away from the display area AA, and the first compensation sub-capacitor 621 is connected to the second data line 22 through the second compensation sub-capacitor 622 and the second capacitor connection line 82, to prevent the first capacitor connection line 81 and the second compensation capacitor 62 from overlapping in the first direction x and to avoid that the length of the first capacitor connection line 81 is increased due to the winding of the first capacitor connection line 81.

Figure 18:
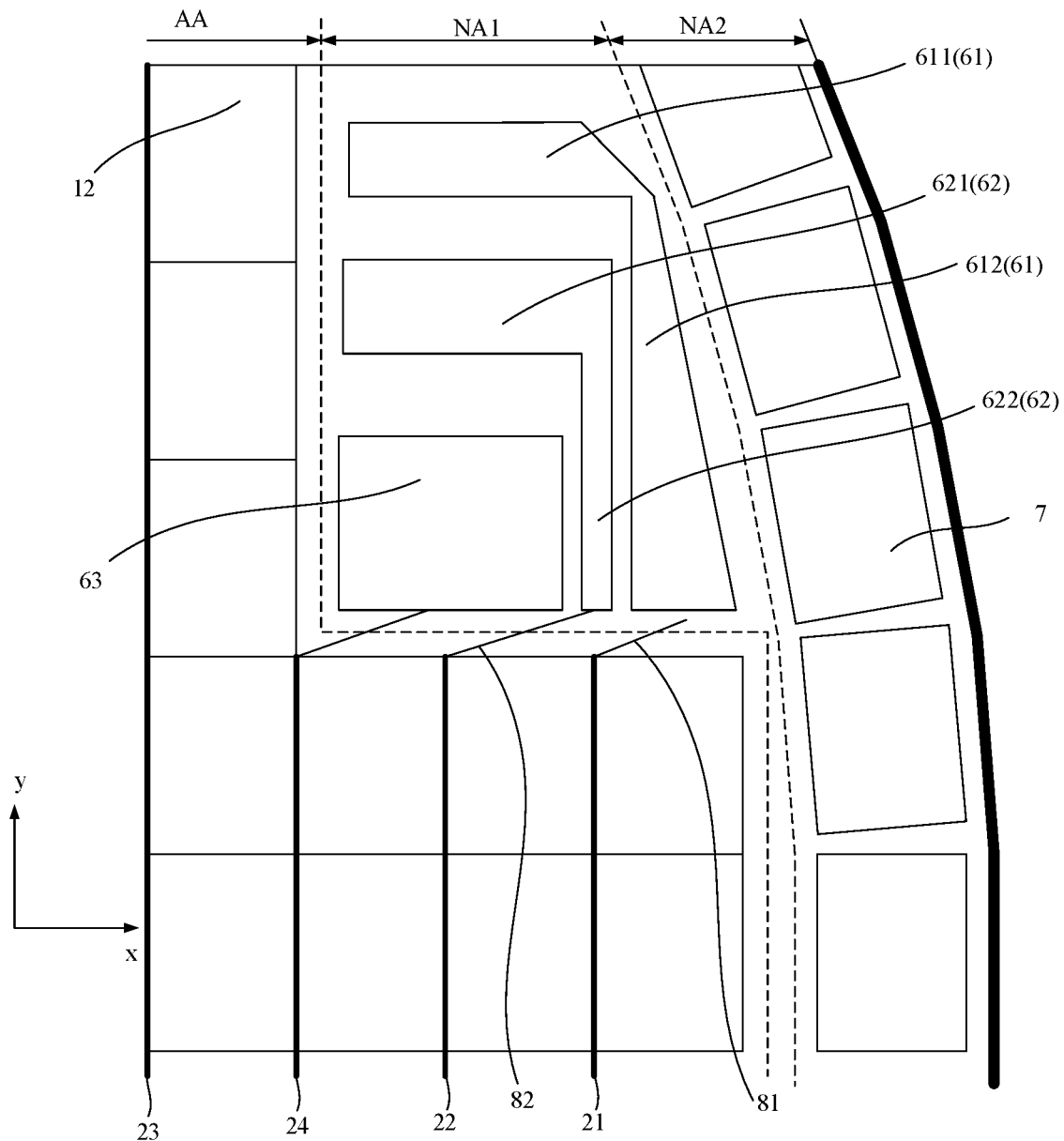
FIG. 18 is another enlarged diagram of a partial area of a display panel provided by an embodiment of the present disclosure.

In an embodiment of the present disclosure, both the first compensation capacitor 61 and the second compensation capacitor 62 can include the first compensation sub-capacitor and the second compensation sub-capacitor. FIG. 18 is another enlarged schematic diagram of a partial area of a display panel provided by an embodiment of the present disclosure. As shown in FIG. 18, the first compensation capacitor 61 includes a first compensation sub-capacitor 611 and a second compensation sub-capacitor 612, and the second compensation capacitor 62 includes a first compensation sub-capacitor 621 and a second compensation sub-capacitor 622.

It should be noted that, in an embodiment of the present disclosure, the first compensation capacitor 61 can be the first type of compensation capacitor 601 formed by two layers of electrode plates, and the second compensation capacitor 62 can be the second type of compensation capacitor 602 formed by three layers of electrode plates. In an embodiment of the present disclosure, when the second compensation capacitor 62 and the scanning connection line 300 overlap in a normal direction of the display panel the second compensation capacitor 62 further includes the first type of compensation capacitor 601, the first type of the compensation capacitor 601 and the scanning connection line 300 overlap in the normal direction of the display panel, and the second type of compensation capacitor 602 and the scanning connection line do not overlap in the normal direction of the display panel.

For example, as shown in FIG. 5, the first compensation capacitor 61 and the second compensation capacitor 62 at least partially overlap in the first direction x, and do not overlap in the second direction y. For example, the maximum length of the first compensation capacitor 61 along the first direction x is greater than the maximum length of the second compensation capacitor 62 along the first direction x. For example, the maximum length of the first compensation capacitor 61 along the first direction x can be greater than a maximum length of the pixel driving circuit connected to the first compensation capacitor 61 along the first direction x, and the maximum length of the first compensation capacitor 61 along the second direction y is smaller than or equal to a maximum length of the second compensation capacitor 62 along the second direction y, to ensure that the first compensation capacitor 61 and the second compensation capacitor 62 have a same capacitance while matching the shape of the first non-display area NA1.

For example, as shown in FIG. 5, the orthographic projections of the first compensation capacitor 61 and the second compensation capacitor 62 on the plane of the display panel can have a shape of a rectangle.

Figure 19:
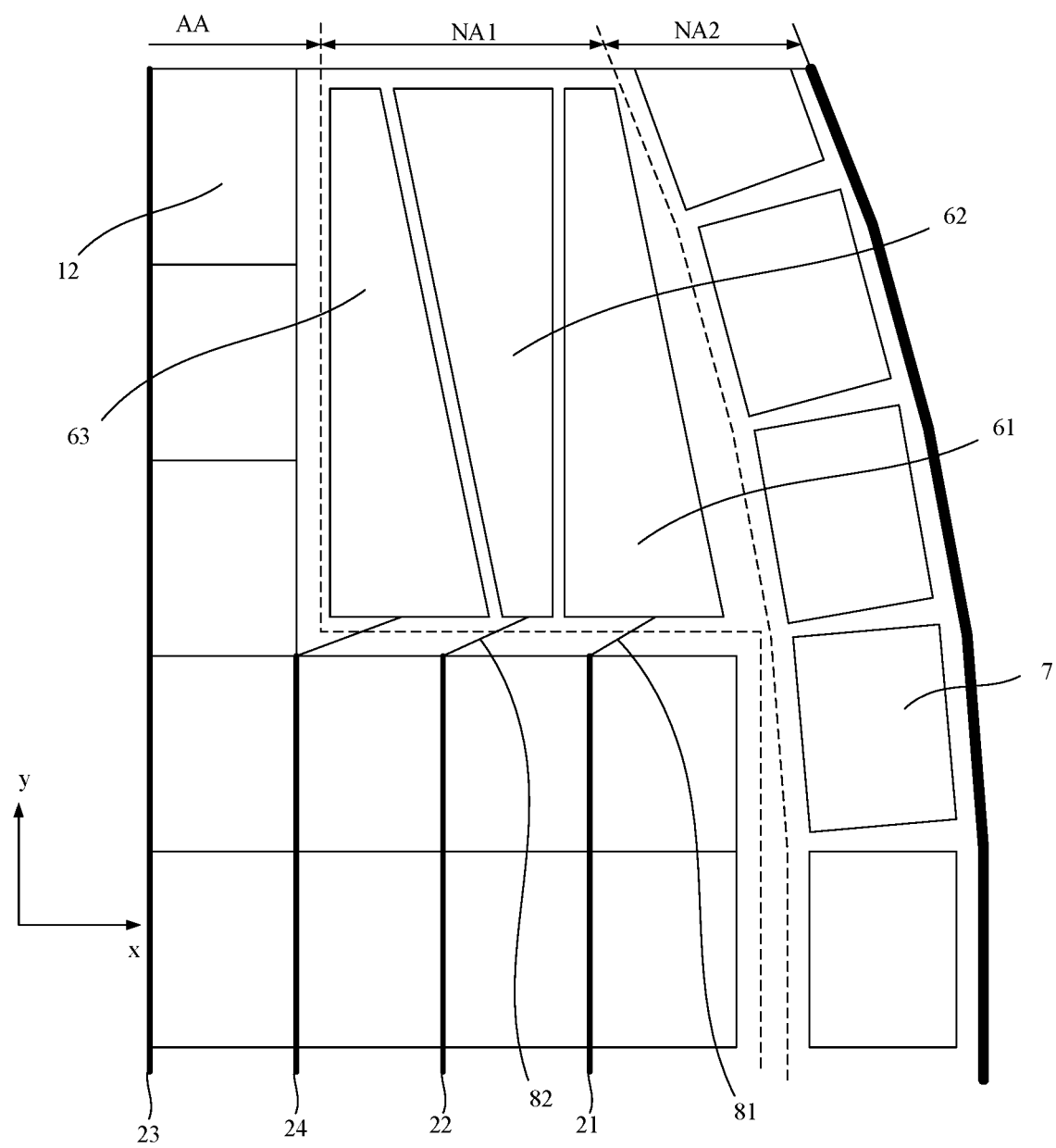
FIG. 19 is another enlarged diagram of a partial area of a display panel provided by an embodiment of the present disclosure.
Figure 20:
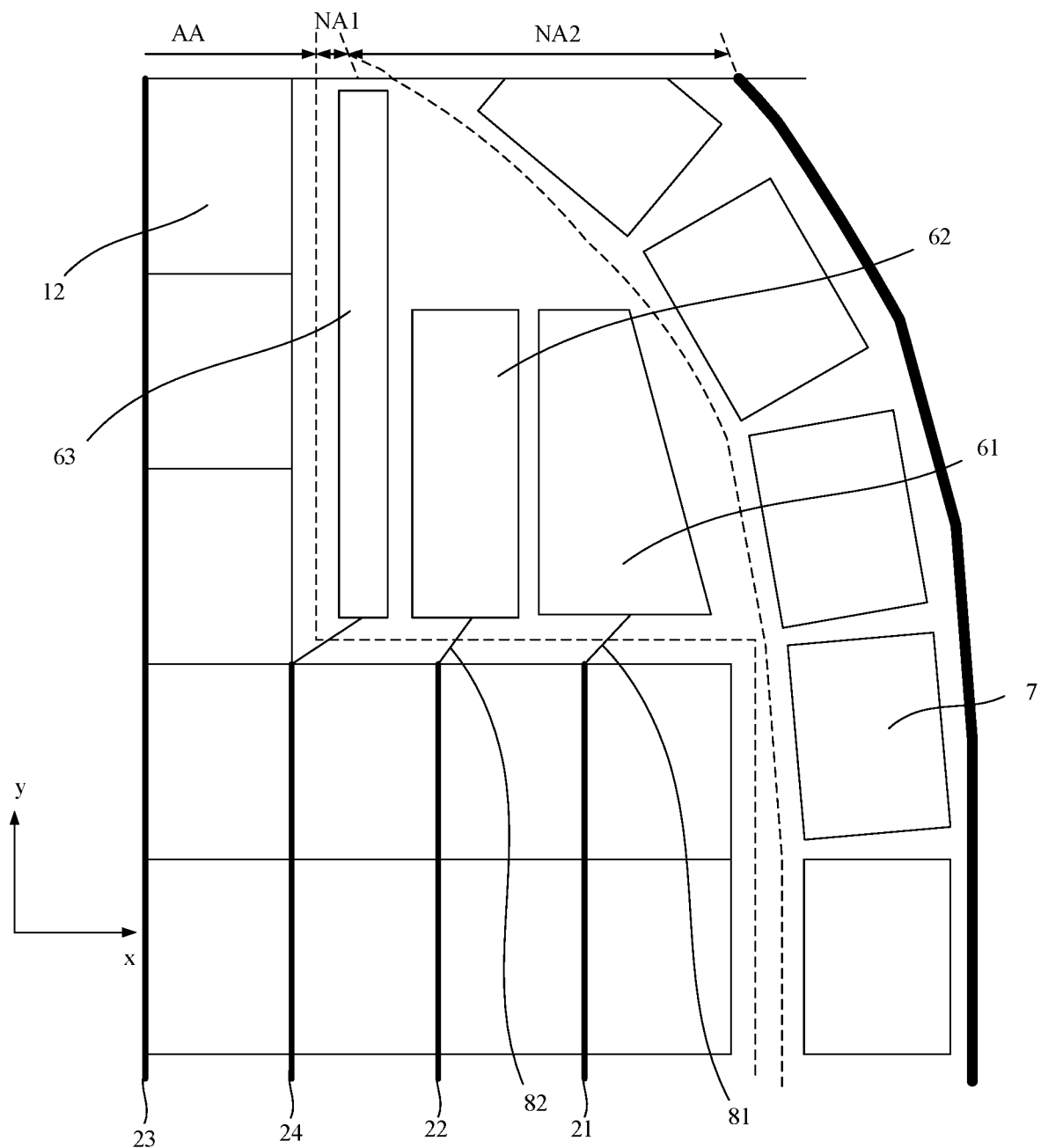
FIG. 20 is another enlarged diagram of a partial area of a display panel provided by an embodiment of the present disclosure.
Figure 21:
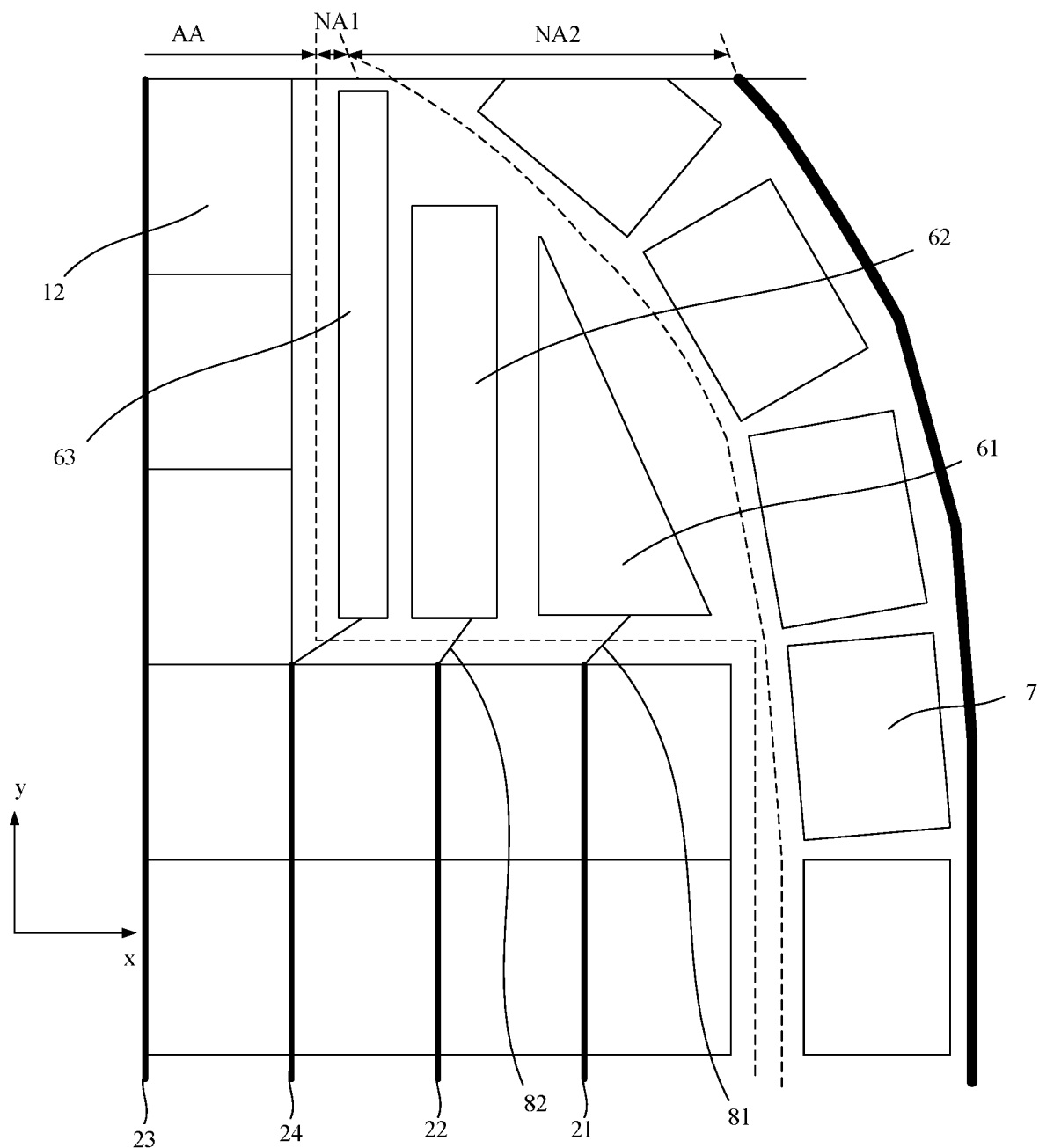
FIG. 21 is another enlarged diagram of a partial area of a display panel provided by an embodiment of the present disclosure.

In an embodiment of the present disclosure, the orthographic projections of the first compensation capacitor 61 and the second compensation capacitor 62 on the plane of the display panel can have a shape of a trapezoid or a triangle. FIG. 19, FIG. 20, and FIG. 21 are respectively enlarged diagrams of a partial area of a display panel provided by embodiments of the present disclosure. As shown in FIG. 19, the orthographic projections of the first compensation capacitor 61 and the second compensation capacitor 62 on the plane of the display panel have a shape of a trapezoid. As shown in FIG. 20, the orthographic projection of the first compensation capacitor 61 on the plane of the display panel has a shape of a trapezoid, and the orthographic projection of the second compensation capacitor 62 on the plane of the display panel has a shape of a rectangle. As shown in FIG. 21, the orthographic projection of the first compensation capacitor 61 on the plane of the display panel has a shape of a triangle, and the orthographic projection of the second compensation capacitor 62 on the plane of the display panel has a shape of a rectangle.

In an embodiment, as shown in FIG. 5 and FIG. 12 to FIG. 21, the first compensation capacitor 61 and the second compensation capacitor 62 can adjacent to each other, and the edge of the first compensation capacitor 61 close to the second compensation capacitor 62 is parallel to the edge of the second compensation capacitor 62 close to the first compensation capacitor 61. With such configuration, the first compensation capacitor 61 and the second compensation capacitor 62 are not in contact with each other, so that the first compensation capacitor 61 and the second compensation capacitor 61 are arranged more compactly, which is beneficial to improve the space utilization of the first non-display area NA1.

For example, as shown in FIG. 19, for the first compensation capacitor 61 and the second compensation capacitor 62 that are adjacent to each other, the length of the first compensation capacitor 61 close to the peripheral circuit 7 in the first direction x can gradually increase along the direction parallel to the second direction y and along a direction from the second non-display area NA2 to the display area AA. The length of the second compensation capacitor 62 with a relatively large distance from the peripheral circuit 7 in the first direction x gradually decreases. With such configuration, the first compensation capacitors 61 and the second compensation capacitors 62 can be arranged more compactly, which is beneficial to improve the space utilization of the first non-display area NA1.

In an embodiment, as shown in FIG. 19, the first compensation capacitor 61 and the second compensation capacitor 62 can have a same shape, and the first compensation capacitor 61 can coincide with the second compensation capacitor 62 after rotation and translation. For example, as shown in FIG. 19, the first compensation capacitor 61 and the second compensation capacitor 62 can have a same shape of a right trapezoid (also referred to as a right angle trapezoid).

As shown in FIG. 5 and FIG. 12 to FIG. 21, the display panel further includes a fourth data line 24 located in the display area AA and electrically connected to M pixel driving circuits 12. In a same sub-pixel row, as shown in FIG. 2, the pixel unit 1 includes at least three sub-pixels connected to the first data line 21, the second data line 22, and the third data line 23. The fourth data line 24 is located at a side of the second data line 22 away from the first data line 21.

The compensation capacitor group 6 in which the first compensation capacitor 61 and the second compensation capacitor 62 are located includes a third compensation capacitor 63 having a same capacitance as the first compensation capacitor 61, and the third compensation capacitor 63 is located at a side of the second compensation capacitor 62 away from the first compensation capacitor 61. In an embodiment of the present disclosure, the third compensation capacitor 63 can be located on the edge of the first non-display area NA1. For example, the third compensation capacitor 63 can be adjacent to the pixel driving circuit 12. When arranging the third compensation capacitor 63, as shown in FIG. 5 and FIG. 12 to FIG. 21, in an embodiment of the present disclosure, the third compensation capacitor 63 and the first compensation capacitor 61 overlap in the first direction x, and the third compensation capacitor 63 and the second compensation capacitor 62 overlap in the first direction x.

Figure 22:
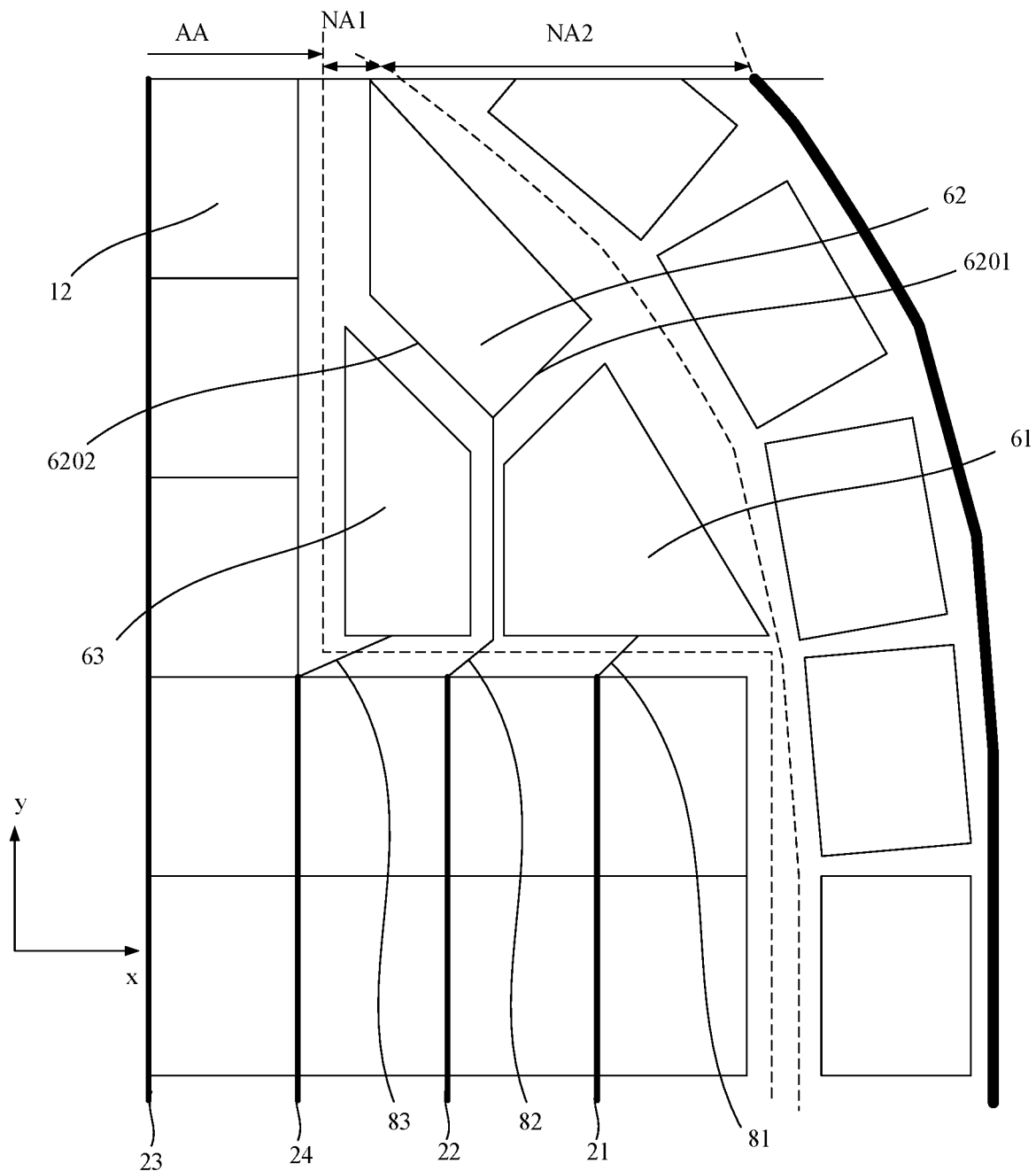
FIG. 22 is another enlarged diagram of a partial area of a display panel provided by an embodiment of the present disclosure.

FIG. 22 is another enlarged diagram of a partial area of a display panel provided by an embodiment of the present disclosure. In an embodiment of the present disclosure, as shown in FIG. 22, the third compensation capacitor 63 and the first compensation capacitor 61 overlap in the first direction x, the third compensation capacitor 63 and the second compensation capacitor 61 overlap in the first direction x, the third compensation capacitor 63 and the first compensation capacitor 61 do not overlap in the second direction y, the third compensation capacitor 63 and the second compensation capacitor 62 overlap in the second direction y, which can reasonably utilize the space of the first non-display area NA1. As shown in FIG. 22, the second compensation capacitor 62 is electrically connected to the second data line 22 through the second capacitor connection line 82, and a part of the second capacitor connection line 82 is located between the first compensation capacitor 61 and the third compensation capacitor 63.

As shown in FIG. 22, the second compensation capacitor 62 includes a first edge 6201 and a second edge 6202, the first edge 6201 is parallel to an edge of a first compensation capacitor 61 adjacent to the first edge 6201, and the second edge 6202 is parallel to an edge of the third compensation capacitor 63 adjacent to the second edge 6202. With such configuration, the first compensation capacitor 61, the second compensation capacitor 62, and the third compensation capacitor 63 are arranged more compactly.

As shown in FIG. 5 and FIG. 12 to FIG. 22, when the third compensation capacitor 63 is adjacent to the display area AA, in an embodiment of the present disclosure, two edges of the third compensation capacitor 63 close to the display area AA are perpendicular to each other.

Figure 23:
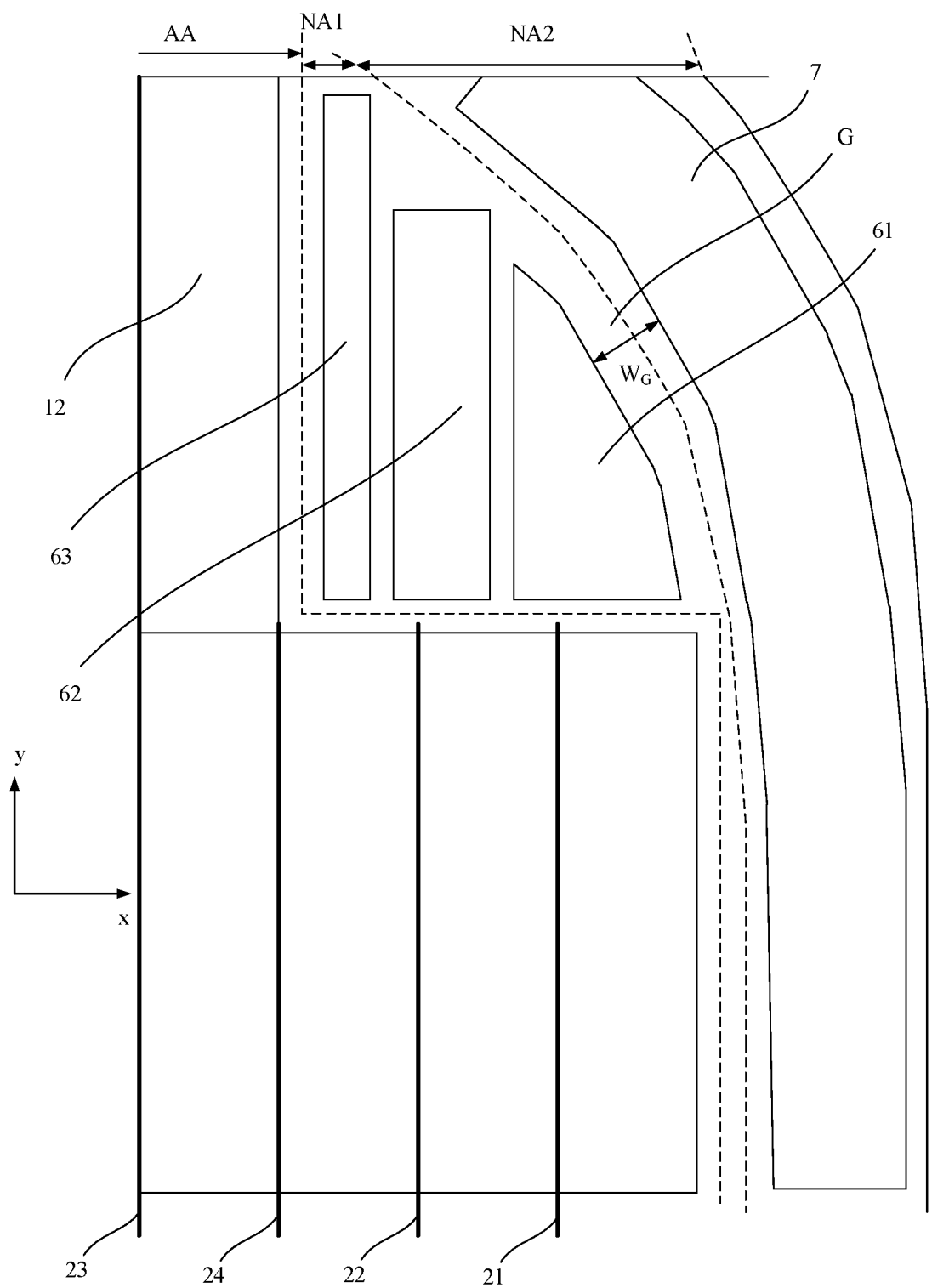
FIG. 23 is another enlarged diagram of a partial area of a display panel provided by an embodiment of the present disclosure.

FIG. 23 is another enlarged schematic diagram of a partial area of a display panel provided by an embodiment of the present disclosure. As shown in FIG. 23, when the first compensation capacitor 61 is adjacent to the peripheral circuit 7, a gap G is formed between the first compensation capacitor 61 and the peripheral circuit 7. In an embodiment of the present disclosure, a width $W_G$ of the gap G can be the same at different positions. A width direction of the gap G is perpendicular to an extending direction of the edge of the first compensation capacitor 61 close to the peripheral circuit 7. In other words, the edge of the peripheral circuit 7 close to the first compensation capacitor 61 is parallel to the edge of the first compensation capacitor 61 close to the peripheral circuit 7. In this way, while the first compensation capacitor 61 and the peripheral circuit 7 are not in contact with each other, the space utilization rate of the first non-display area NA1 can be improved.

It should be noted that the same width $W_G$ of the gap G at different positions refers to that the width $W_G$ of the gap G at different positions are the same within an allowable range of process deviation. That is, when the edges of the first compensation capacitor 61 and the peripheral circuit 7 are deviated due to process fluctuations, if a difference between the width of the gap between of the first compensation capacitor 61 and the peripheral circuit 7 at a certain position and a reference width is within the allowable range of process deviation, the edges of the first compensation capacitor 61 and the peripheral circuit 7 can also be regarded as being parallel to each other.

Figure 24:
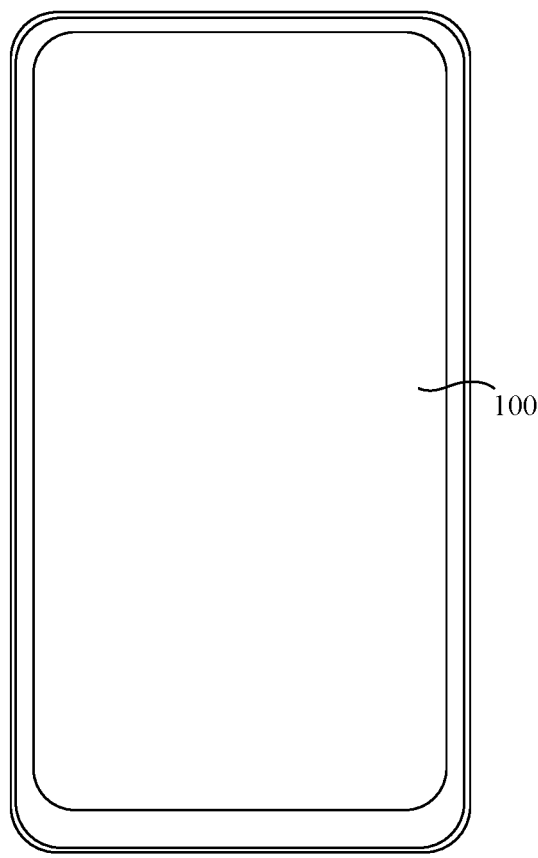
FIG. 24 is a schematic diagram of a display device provided by an embodiment of the present disclosure.

An embodiment of the present disclosure also provides a display device. FIG. 24 is a schematic diagram of a display device provided by an embodiment of the present disclosure. As shown in FIG. 24, the display device includes the display panel 100 described above. The specific structure of the display panel 100 has been described in detail in the above-mentioned embodiments, and will not be repeated herein. The display device shown in FIG. 24 is only schematically illustrated, and the display device can be any electronic device with a display function, such as a mobile phone, a tablet computer, a laptop computer, an electronic paper book, or a television.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

What is claimed is:

1. A display panel having a display area, a first non-display area, and a second non-display area, the first non-display area being located between the display area and the second non-display area, the display panel comprising:
    a plurality of sub-pixels located in the display area;
    a first data line, a second data line and a third data line that are arranged along a first direction and each extend along a second direction intersecting with the first direction; wherein the first data line is electrically connected to M sub-pixels of the plurality of sub-pixels, the second data line is electrically connected to M sub-pixels of the plurality of sub-pixels, and the third data line is electrically connected to N sub-pixels of the plurality of sub-pixels, where 1≤M<N, and both M and N are integers;
    compensation capacitor groups located in the first non-display area, wherein each of the compensation capacitor groups comprises a first compensation capacitor electrically connected to the first data line, and a second compensation capacitor electrically connected to the second data line; and the first compensation capacitor and the second compensation capacitor have a same capacitance; and
    a peripheral circuit located in the second non-display area, wherein the first non-display area has a length gradually decreasing along a direction parallel to the first direction and along a direction from the display area to the second non-display area, and the length of the first non-display area corresponds to a size of the first non-display area along the second direction.

2. The display panel of claim 1, wherein the first compensation capacitor and the second compensation capacitor at least partially overlap in the first direction, and the first compensation capacitor and the second compensation capacitor at least partially overlap in the second direction.

3. The display panel of claim 2, wherein at least a part of the first compensation capacitor is located at a side of the second compensation capacitor close to the peripheral circuit; and the first compensation capacitor comprises a first compensation sub-capacitor and a second compensation sub-capacitor that are connected in series to each other, wherein the first compensation sub-capacitor and the second compensation capacitor at least partially overlap in the second direction, and the second compensation sub-capacitor and the second compensation capacitor at least partially overlap in the first direction.

4. The display panel of claim 1, wherein at least one of the first compensation capacitor or the second compensation capacitor comprises a first type of compensation capacitor and a second type of compensation capacitor, wherein the first type of compensation capacitor comprises two layers of electrode plates that are stacked along a thickness direction of the display panel, and the second type of compensation capacitor comprises three layers of electrode plates that are stacked along the thickness direction of the display panel.

5. The display panel of claim 4, wherein the first compensation capacitor is located at a side of the second compensation capacitor close to the peripheral circuit, and the first compensation capacitor comprises only the first type of compensation capacitor.

6. The display panel of claim 4, wherein the first type of the compensation capacitors and the second type of the compensation capacitors are alternately arranged along the second direction.

7. The display panel of claim 4, wherein an orthographic projection of the first type of the compensation capacitor on a plane of the display panel has an area smaller than an area of an orthographic projection of the second type of compensation capacitor on the plane of the display panel.

8. The display panel of claim 4, further comprising:
a scanning line electrically connected to one of the plurality of sub-pixels; and
a reference voltage line electrically connected to one of the plurality of sub-pixels,
wherein the first type of compensation capacitor comprises a first electrode and a second electrode, and the second type of compensation capacitor comprises a third electrode, a fourth electrode, and a fifth electrode; and
wherein the first electrode and the third electrode are located in a same layer as the scanning line, the second electrode and the fourth electrode are located in a same layer as the reference voltage line, and the fifth electrode is located at a side of the third electrode facing away from the fourth electrode and is located in a same layer as the first data line, the second data line and the third data line that are located in the display area.

9. The display panel of claim 8, wherein the fourth electrode is located between the third electrode and the fifth electrode, and the third electrode and the fifth electrode are connected to each other through a via.

10. The display panel of claim 2, wherein the first compensation capacitor and the second compensation capacitor are adjacent to each other; and
along a direction parallel to the second direction and along a direction from the second non-display area to the display area, the first compensation capacitor has a length along the first direction that gradually increases, and the second compensation capacitor has a length along the first direction that gradually decreases.

11. The display panel of claim 10, wherein the first compensation capacitor and the second compensation capacitor have a same shape.

12. The display panel of claim 1, wherein the first compensation capacitor and the second compensation capacitor at least partially overlap in the first direction, and the first compensation capacitor and the second compensation capacitor do not overlap in the second direction; and
the first compensation capacitor has a maximum length along the first direction that is greater than a maximum length of the second compensation capacitor along the first direction, and the first compensation capacitor has a maximum length along the second direction that is smaller than or equal to a maximum length of the second compensation capacitor along the second direction.

13. The display panel of claim 12, further comprising:
a fourth data line located in the display area and electrically connected to M sub-pixels of the plurality of sub-pixels,
wherein each of the compensation capacitor groups further comprises a third compensation capacitor having a same capacitance as the first compensation capacitor, wherein the third compensation capacitor and the first compensation capacitor overlap in the first direction, and the third compensation capacitor and the second compensation capacitor overlap in the first direction, the third compensation capacitor and the first compensation capacitor do not overlap in the second direction, and the third compensation capacitor and the second compensation capacitor overlap in the second direction.

14. The display panel of claim 13, wherein the third compensation capacitor has a first edge and a second edge, wherein the first edge is parallel to an edge of the first compensation capacitor in one of the compensation capacitor groups that is adjacent to the third compensation capacitor, and the second edge is parallel to an edge of the second compensation capacitor in one of the compensation capacitor groups that is adjacent to the third compensation capacitor.

15. The display panel of claim 1, wherein a compensation capacitor in each of the compensation capacitor groups that is adjacent to the display area comprises two edges close to the display area and perpendicular to each other.

16. The display panel of claim 1, wherein the first compensation capacitor is adjacent to the peripheral circuit; and
the first compensation capacitor has a length gradually decreasing along the direction parallel to the first direction and along the direction from the display area to the second non-display area, and the length of the first compensation capacitor corresponds to a size of the first compensation capacitor along the second direction.

17. The display panel of claim 1, wherein the first compensation capacitor is adjacent to the peripheral circuit, and a gap is formed between the first compensation capacitor and the peripheral circuit and has a same width at different positions.

18. The display panel of claim 1, wherein the first compensation capacitor is adjacent to the peripheral circuit and has an edge close to the peripheral circuit, and the edge has a shape of a straight line or an arc.

19. The display panel of claim 1, wherein the first compensation capacitor and the second compensation capacitor are adjacent to each other, and the first compensation capacitor has an edge close to the second compensation capacitor and parallel to an edge of the second compensation capacitor close to the first compensation capacitor.

20. A display device comprising a display panel having a display area, a first non-display area, and a second non-display area, the first non-display area being located between the display area and the second non-display area, the display panel comprising:

a plurality of sub-pixels located in the display area;

a first data line, a second data line and a third data line that are arranged along a first direction and each extend along a second direction intersecting with the first direction; wherein the first data line is electrically connected to M sub-pixels of the plurality of sub-pixels, the second data line is electrically connected to M sub-pixels of the plurality of sub-pixels, and the third data line is electrically connected to N sub-pixels of the plurality of sub-pixels, where $1 \leq M < N$, and both M and N are integers;

compensation capacitor groups located in the first non-display area, wherein each of the compensation capacitor groups comprises a first compensation capacitor electrically connected to the first data line, and a second compensation capacitor electrically connected to the second data line; and the first compensation capacitor and the second compensation capacitor have a same capacitance; and a peripheral circuit located in the second non-display area, wherein the first non-display area has a length gradually decreasing along a direction parallel to the first direction and along a direction from the display area to the second non-display area, and the length of the first non-display area corresponds to a size of the first non-display area along the second direction.

* * * * *